United States Patent [19]

Akagiri

[11] 4,369,509
[45] Jan. 18, 1983

[54] GAIN CONTROL CIRCUIT FOR NOISE REDUCTION SYSTEM

[75] Inventor: Kenzo Akagiri, Kanagawa, Japan

[73] Assignee: Sony Corporation, Tokyo, Japan

[21] Appl. No.: 151,154

[22] Filed: May 19, 1980

[30] Foreign Application Priority Data

May 24, 1979 [JP] Japan .................................. 54-64181

[51] Int. Cl.³ ............................................ G11B 5/027
[52] U.S. Cl. ...................................... 369/174; 360/25; 360/68
[58] Field of Search ............... 369/174, 175, 107, 134; 360/25, 67, 68; 179/1 P; 325/169; 333/14

[56] References Cited

U.S. PATENT DOCUMENTS

| 3,206,556 | 9/1965 | Bachman et al. .................. 369/174 |
| 3,379,839 | 4/1968 | Bennett ............................... 360/67 |
| 3,665,345 | 5/1972 | Dolby .................................. 333/14 |
| 3,729,693 | 4/1973 | Dolby .................................. 333/14 |
| 4,162,462 | 7/1979 | Endoh et al. ..................... 179/1 P |
| 4,169,219 | 9/1979 | Beard ................................. 369/124 |

Primary Examiner—Bernard Konick
Assistant Examiner—Donald McElheny, Jr.
Attorney, Agent, or Firm—Lewis H. Eslinger; Alvin Sinderbrand

[57] ABSTRACT

An input gain control circuit for an audio signal recorder includes a first transmission path for compressing an audio signal supplied thereto and having a variable gain amplifier and a control circuit which supplies a control signal to the variable gain amplifier for varying the gain thereof, a second transmission path for transmitting the audio signal with substantially unity gain through a resistor thereof, and an adding amplifier for adding the compressed audio signal from the first transmission path and the audio signal with substantially unity gain from the second transmission path whereby the compressed audio signal is effectively transmitted for recording when the level of the audio signal is below a predetermined value and the audio signal with substantially unity gain is transmitted for recording when the level of the audio signal is above the predetermined value. A complementary output gain control circuit substantially recreates the original audio signal when the above recorded signal is reproduced.

30 Claims, 31 Drawing Figures

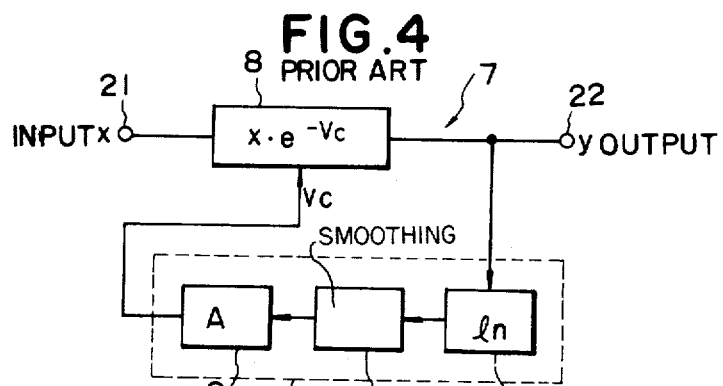
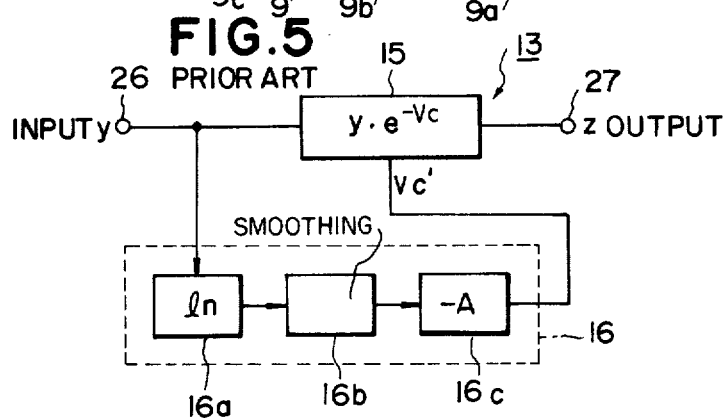
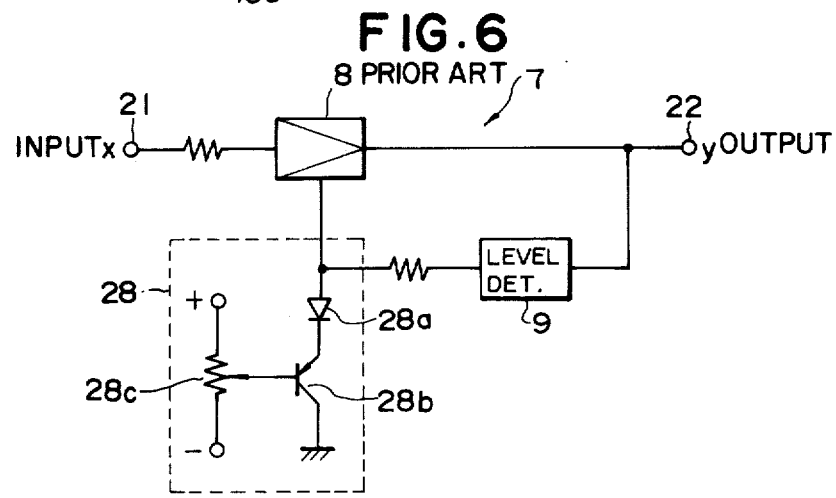

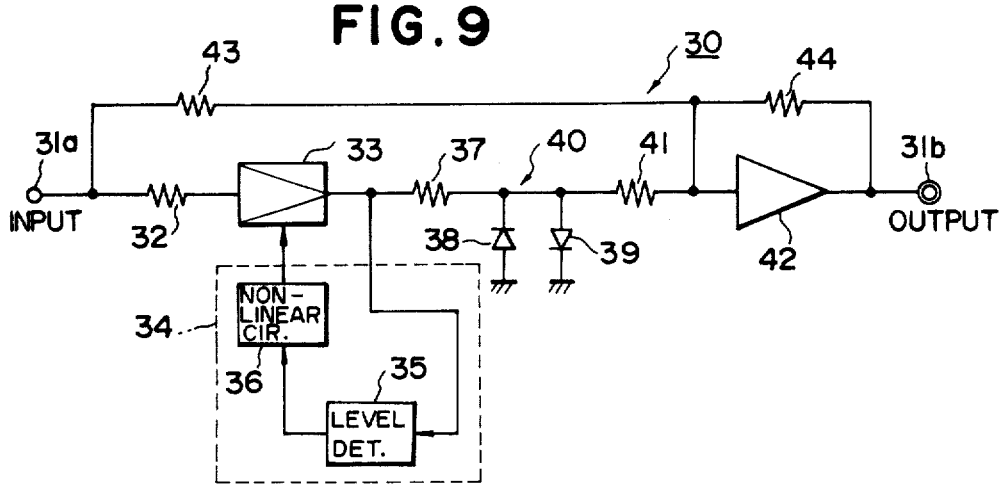
FIG. 9
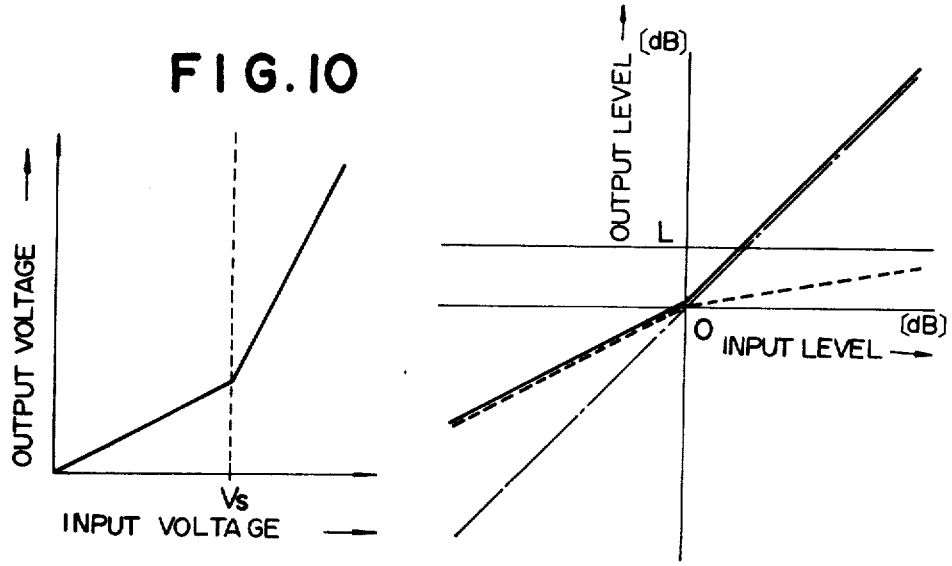
FIG. 10
FIG. 11

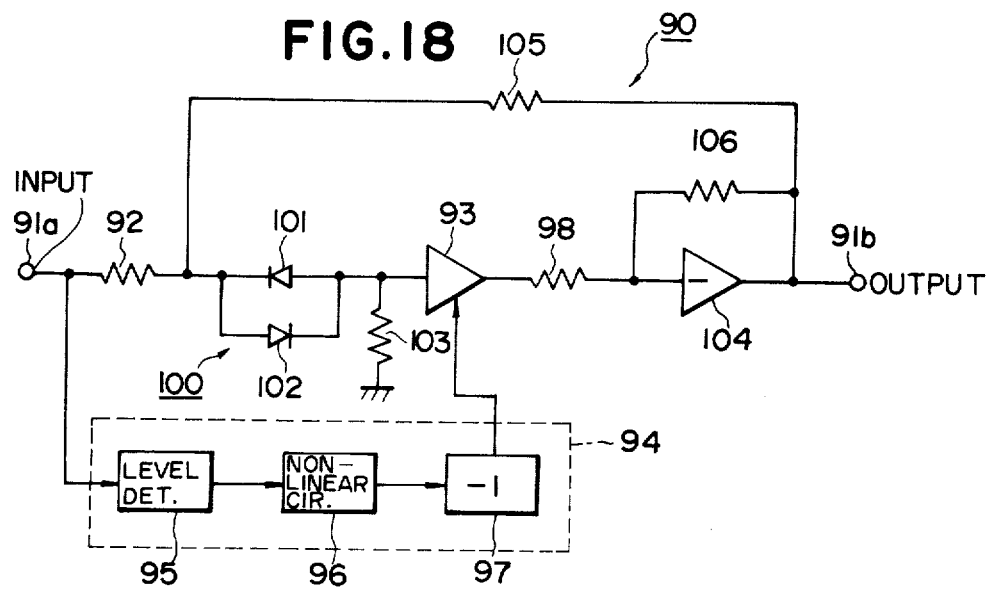
FIG.18
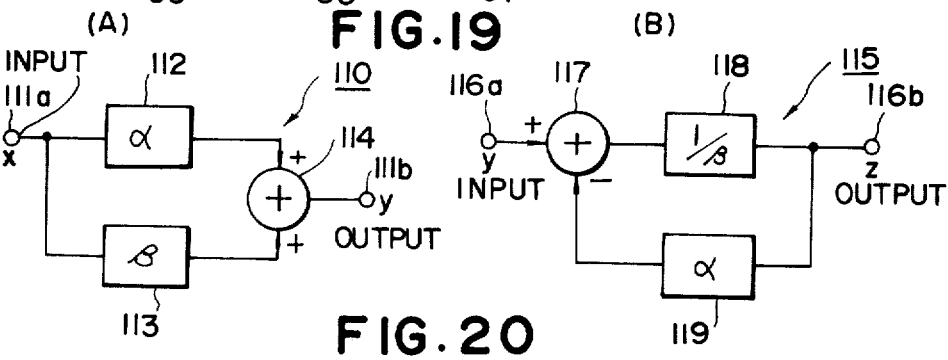
FIG.19
FIG.20

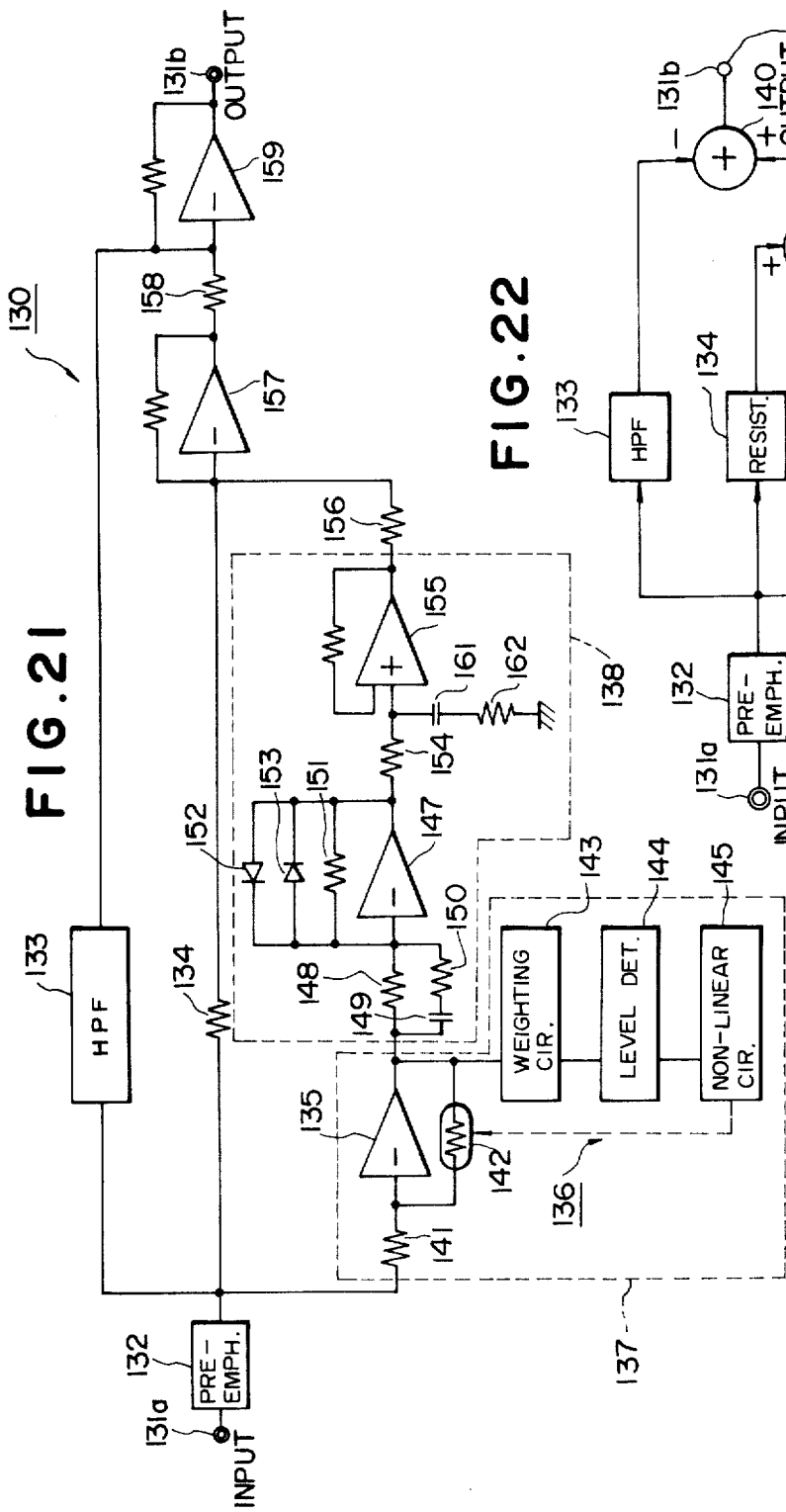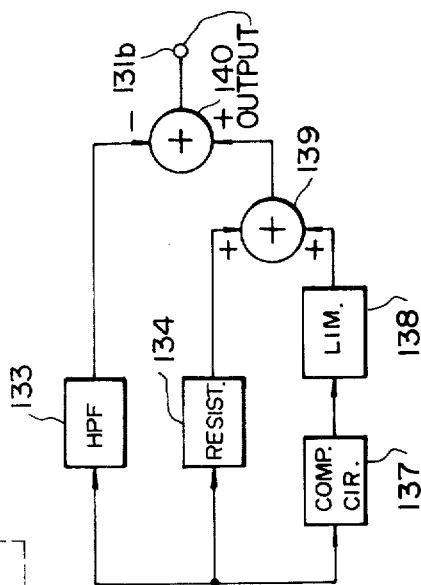

GAIN CONTROL CIRCUIT FOR NOISE REDUCTION SYSTEM

BACKGROUND OF THE INVENTION

1. Field of the Invention

This invention relates generally to information signal recording and reproducing apparatus and, more particularly, is directed to a gain control circuit for reducing the noise generally accompanying a reproduced information signal in an information signal recording and reproducing apparatus.

2. Description of the Prior Art

Noise reduction systems for reducing noise and distortion which accompany a reproduced information signal in, for example, an audio tape recorder, are well-known in the art. Such noise reduction systems are designed to increase the dynamic range of the signal that can be recorded and reproduced from a recording medium such as a magnetic tape. Such noise reduction systems generally incorporate an encoding process which compresses the level of the information signal and amplifies the high frequency components thereof prior to recording the signal on the recording medium. A decoding process is provided during the reproducing operation which is complementary to the compression and amplification which occur during the recording operation. In other words, the decoding process results in an expansion of the level of the reproduced information signal and an attenuation of the high frequency components thereof.

In one known noise reduction system, during the recording operation, the information signal is first transmitted through a pre-emphasis circuit which is provided with a large gain for pre-emphasizing the high frequency components of the signal supplied thereto. The pre-emphasized signal from the pre-emphasis circuit is then supplied to a compression circuit which compresses the pre-emphasized signal when the level of the information signal is less than a predetermined value and which transmits the signal with substantially unity gain for signal levels greater than the predetermined value. For example, the compression circuit may include a variable gain amplifier, such as a voltage controlled amplifier, which acts on the output from the pre-emphasis circuit. A control voltage for varying the gain of the variable gain amplifier is derived from a level detecting circuit and a limiter circuit in response to the output from the variable gain amplifier. When the level of the information signal is less than the predetermined value, the limiter circuit is inoperative so that the control signal from the level detecting circuit results in the variable gain amplifier imparting a compression characteristic to the information signal and when the level of the information signal is greater than the predetermined value, the limiter circuit grounds the control signal so that the variable gain amplifier transmits the information signal with substantially unity gain. Complementary de-emphasis and expansion circuitry are provided during the reproducing operation.

However, there are certain disadvantages with such noise reduction system. For example, in addition to the variable gain amplifier requiring adjustment, the limiter circuit must also be precisely adjusted for correct operation and such adjustment is often difficult. In addition, such noise reduction system exhibits a poor transient characteristic for changes in the level of the information signal. In particular, the compression circuit of the noise reduction system fails to adequately respond when the level of the information signal is abruptly increased, resulting in overshoots being created in the information signal. This occurs because the gain of the variable gain amplifier cannot instantaneously change with changes in the signal level with the result that the large gain normally applied to low level signals is applied to the high level signals for a short time when the level of the information signal abruptly rises from a low to a high level. This results in a so-called "noise breathing" phenomenon. This is particularly noticeable when the level of the information signal changes from a level below the aforementioned predetermined value to a level above the predetermined value whereby the gain of the variable gain amplifier cannot change instantaneously from its compression gain characteristic to its substantially unity gain characteristic. Such overshoots in the level of the information signal result in a distorted waveform being recorded and reproduced from the recording medium due to magnetic saturation of the recording tape.

OBJECTS AND SUMMARY OF THE INVENTION

Accordingly, it is a principal object of this invention to provide a gain control circuit for an information signal recording and reproducing apparatus that avoids the above-described difficulties encountered with the prior art.

More particularly, it is an object of this invention to provide a gain control circuit for reducing the noise generally accompanying a reproduced information signal in an information signal recording and reproducing apparatus.

It is another object of this invention to provide a gain control circuit for an information signal recording and reproducing apparatus which requires minimal adjustment of the various elements thereof so as to obtain varying gain characteristics for varying levels of an information signal.

It is still another object of this invention to provide a gain control circuit for an information signal recording and reproducing apparatus in which the information signal is compressed during the recording operation and expanded during the reproducing operation by respective first transmission paths when the level of the information signal supplied thereto is lower than a predetermined value and in which the information signal is transmitted by respective second transmission paths with substantially unity gain during the recording and reproducing operation when the level of the information signal is greater than the predetermined value.

It is yet another object of this invention to provide a gain control circuit for an information signal recording and reproducing apparatus in which overshoots in the information signal and resulting magnetic saturation of the magnetic recording tape are substantially eliminated.

It is a further object of this invention to provide a gain control circuit for an information signal recording and reproducing apparatus in which complementary matching of the compression and expansion circuits thereof is easily obtained.

It is a still further object of this invention to provide a gain control circuit for an information signal recording and reproducing apparatus in which respective third transmission paths are provided in the recording and reproducing circuits for increasing the signal-to-noise ratio for low level, high frequency signals.

It is a yet further object of this invention to provide a gain control circuit for an information signal recording and reproducing apparatus, as aforesaid, which is of relatively simple construction, and which may be conveniently employed in the recording and reproducing circuits of an audio tape recording and reproducing apparatus.

In accordance with an aspect of this invention, in apparatus for recording an information signal on a recording medium by a transducer, gain control means comprises a first transmission path for compressing the information signal, a second transmission path for transmitting the information signal with substantially unity gain, and means for effectively supplying the compressed information signal to the recording device when the level of the information signal is below a predetermined value and for effectively supplying the information signal with substantially unity gain to the transducer when the level of the information signal is above the predetermined value. In addition, in the reproducing operation of the transducer, complementary gain control means is provided for the output thereof and includes a complementary first transmission path for expanding the reproduced information signal, a complementary second transmission path for transmitting the reproduced information signal with substantially unity gain, and means for effectively supplying the expanded information signal from the transducer when the level of the information signal is below a predetermined value and for effectively supplying the information signal with substantially unity gain from the transducer when the level of the information signal is above the predetermined value.

The above, and other, objects, features and advantages of the invention, will be apparent in the following detailed description of the illustrative embodiments of the invention which is to be read in connection with the accompanying drawings.

BRIEF DESCRIPTION OF THE DRAWINGS

FIG. 4 is a block diagram of a known compression circuit that may be used in the gain control circuit of FIG. 1;

FIG. 5 is a block diagram of a known expansion circuit that may be used in the gain control circuit of FIG. 1;

FIG. 6 is a block-circuit wiring diagram of another known compression circuit that may be used in the gain control circuit of FIG. 1;

FIG. 9 is a block-circuit wiring diagram of a compression circuit of the gain control circuit according to one embodiment of the present invention;

FIG. 10 is a graphical diagram illustrating the input-output level characteristic of a non-linear circuit of the compression circuit of FIG. 9;

FIG. 11 is a graphical diagram illustrating the input-output level characteristic of the compression circuit of FIG. 9;

FIG. 18 is a block-circuit wiring diagram of an expansion circuit of the gain control circuit according to the present invention and having a characteristic complementary to that of the compression circuit of FIG. 9;

FIG. 19A is a block diagram to which reference will be made in explaining the operation of the compression circuit of FIG. 9;

FIG. 19B is a block diagram to which reference will be made in explaining the operation of the expansion circuit of FIG. 18;

FIG. 20 is a block diagram to which reference will be made in explaining another mode of operating the expansion circuit of FIG. 18 by using many of the same components of the compression circuit of FIG. 9;

FIG. 21 is a block-circuit wiring diagram of another embodiment of an input gain control circuit according to the present invention;

FIG. 22 is a block diagram to which reference will be made in explaining the operation of the circuit of FIG. 21;

DETAILED DESCRIPTION OF THE PREFERRED EMBODIMENTS

Figure 1:
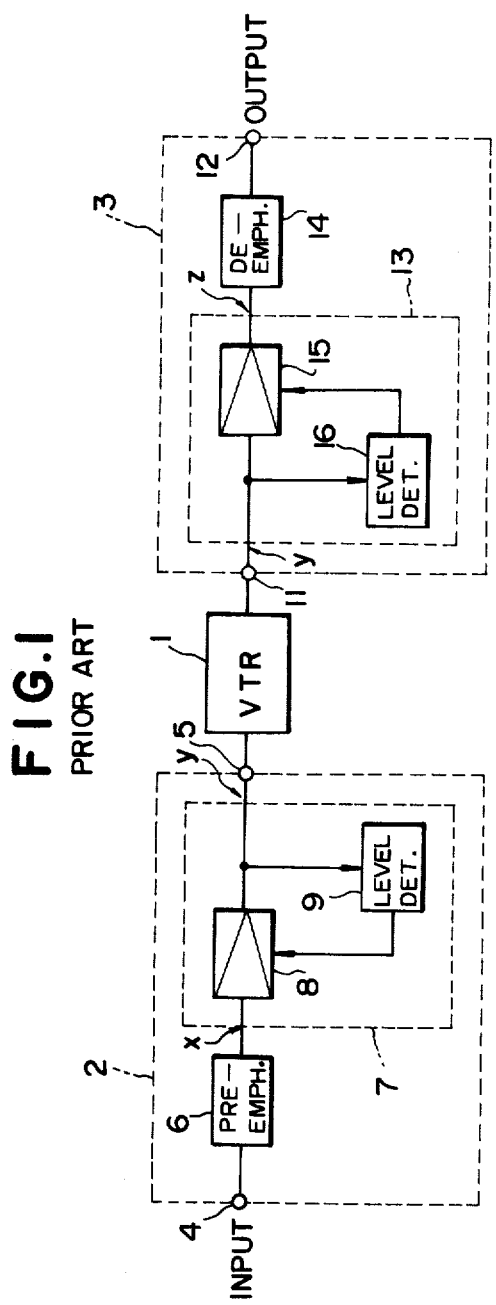
FIG. 1 is a block diagram of a gain control circuit for a noise reduction system according to the prior art.
Figure 2:
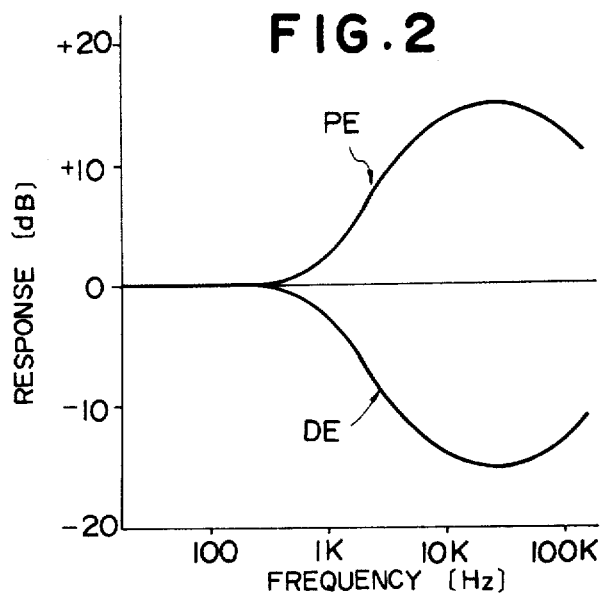
FIG. 2 is a graphical diagram illustrating the pre-emphasis and de-emphasis frequency characteristics for the gain control circuit of FIG. 1.

Referring to the drawings in detail, and initially to FIG. 1 thereof, it will be seen that, in a gain control circuit for an information signal recording and reproducing apparatus according to the prior art, as there illustrated, an information signal is supplied to an input terminal 4 of an input gain control or encoder circuit 2 for removing certain high frequency components of the signal, such as noise or the like. Encoder circuit 2 includes a pre-emphasis circuit 6 supplied with the information signal from input terminal 4 and having a large gain for pre-emphasizing the high frequency components of the information signal, as illustrated by curve PE of FIG. 2. The output from pre-emphasis circuit 6 is supplied to a compression circuit 7 of encoder circuit 2 and, more particularly, to a variable gain amplifier 8, such as a voltage controlled amplifier, of compression circuit 7. It should be appreciated that, although pre-emphasis circuit 6 is shown in FIG. 1 to be positioned before compression circuit 7, this order may be reversed without changing the effect on the signal. Compression circuit 7 further includes a level detecting circuit 9 which detects the level of the output from variable gain amplifier 8 and produces a DC control voltage in response thereto which is supplied to variable gain amplifier 8 for varying the gain thereof. The input-output level characteristic for compression circuit 7 is shown by curve R in FIG. 3 where it is seen that the input information signal x supplied thereto is compressed in a substantially linear manner on a logarithmic graph.

Referring now to FIG. 4, there is shown one embodiment of a known compression circuit 7 which is used in the prior art gain control circuit of FIG. 1. As shown therein, variable gain amplifier 8 produces an output signal y which can be represented as follows:

$$y = x \cdot e^{-V_c} \tag{1}$$

where $V_c$ is the control voltage supplied to variable gain amplifier 8 from level detecting circuit 9. Detecting circuit 9 includes a natural logarithmically converting circuit 9a which is supplied with the output from variable gain amplifier 8 and, in turn, supplies a natural logarithmically converted signal to a smoothing circuit 9b. The signal from this latter circuit is amplified by an amplifier 9c having a gain A and which is also included in level detecting circuit 9. Amplifier 9c thereby supplies control voltage $V_c$ which can be represented as follows, to variable gain amplifier 8:

$$V_c = A \cdot \ln y = \ln y^A \tag{2}$$

Equations (1) and (2) can be combined to form a simplified expression for output signal y as follows:

$$y = x \cdot e^{-V_c} = x \cdot e^{-\ln y^A} = x \cdot y^{-A} \tag{3}$$

$$y^{1+A} = x$$

$$y = x^{\frac{1}{1+A}}.$$

If input signal x and output signal y are transformed into their decibel or logarithmic equivalents, output signal y can be represented as follows:

$$\log y = \frac{1}{1+A} \log x \tag{4}$$

Figure 3:
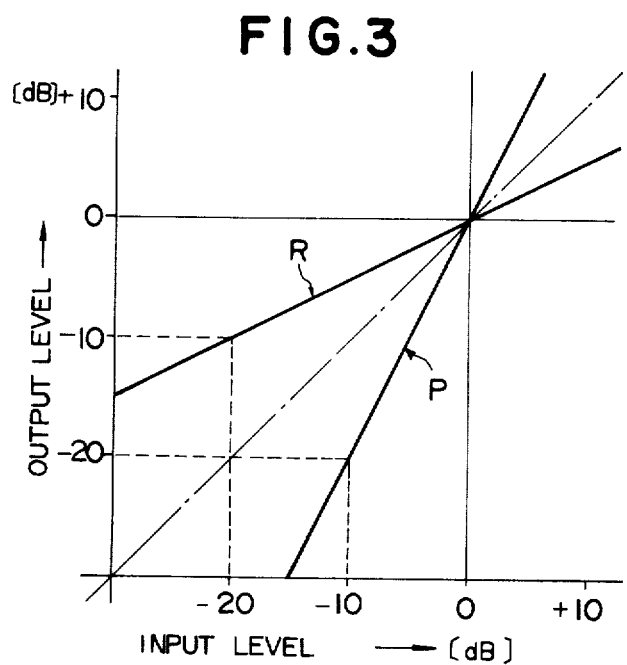
FIG. 3 is a graphical diagram illustrating the compression and expansion characteristics of the gain control circuit of FIG. 1.

It should, therefore, be appreciated that input signal x and output signal y are in logarithmic-linear relation, as illustrated by curve R in FIG. 3 with output signal y being compressed in relation to input signal x and with the compression ratio being dependent on the gain A of amplifier 9c. For example, if A=1 and log y=½ log x, then, as shown in FIG. 3, when input signal x has a level of −20 dB, output signal y is compressed to a level of −10 dB. The compressed signal from compression circuit 7 is then fed to a recording and reproducing device 1 through an output terminal 5 of encoder circuit 2. Device 1 may be of conventional design, such as an audio signal tape recording and reproducing apparatus, and is effective to record on a magnetic tape or other recording medium the encoded signal received at terminal 5.

Referring back to FIG. 1, it is seen that, in the information signal recording and reproducing apparatus according to the prior art as there illustrated, a reproducing section includes an output gain control or decoder circuit 3 having an input terminal 11 supplied with the encoded signal reproduced from the recording medium. Decoder circuit 3 transforms the reproduced encoded signal into the original information signal supplied to input terminal 4 of encoder circuit 2 and acts on the signal supplied thereto in a manner substantially complementary to encoder circuit 2. Decoder circuit 3 includes an expansion circuit 13 for expanding ther reproduced information signal in a manner substantially complementary to the amount of compression from compression circuit 7. Thus, as shown in FIG. 3 by curve P, the input-output level characteristic of expansion circuit 13 is a mirror image of curve R of compression circuit 7. For example, when the level of the information signal supplied to compression circuit 7 is −20 dB, compression circuit 7 produces an output signal having a level of −10 dB. When this output signal having a level of −10 dB is applied to expansion circuit 13, the information signal is returned to its original level of −20 dB, as shown by the dotted lines in FIG. 3. The output of expansion circuit 13 is supplied to a de-emphasis circuit 14 also included in decoder circuit 3 for attenuating the high frequency components of the reproduced encoded signal in a manner substantially complementary to the amount of pre-emphasis from pre-emphasis circuit 6, as shown by curve DE in FIG. 2. It should be realized, however, that the positional arrangement of expansion circuit 13 and de-emphasis circuit 14 may be reversed with no change in the effect on the reproduced encoded signal. The resulting reproduced signal is supplied to an output terminal 12 of decoder circuit 3.

As shown in FIG. 1, expansion circuit 13 includes a variable gain amplifier 15 supplied with the reproduced encoded signal from input terminal 11 and which is similar to variable gain amplifier 8 of compression circuit 7. A level detecting circuit 16 is also supplied with the encoded signal and produces a control voltage in response thereto which is supplied to variable gain amplifier 15 so as to regulate the gain thereof.

Referring now to FIG. 5, there is shown one embodiment of an expansion circuit 13 commonly used with decoder circuit 3 of FIG. 1. As shown therein, variable gain amplifier 15 is supplied at an input terminal 26 thereof with encoded information signal y and produces an output signal z at an output terminal 27 in response thereto which can be represented as follows:

$$z = y \cdot e^{-V_c'} \tag{5}$$

wherein $V_c'$ is the control voltage supplied to amplifier 15 by level detecting circuit 16. This latter circuit includes a natural logarithmically converting circuit 16a supplied with encoded information signal y and which, in turn, produces an output which is supplied through a smoothing circuit 16b to an amplifier 16c having a gain of $-A$. Amplifier 16c produces control voltage $V_c'$ which is represented as follows:

$$V_c' = -A \cdot \ln y \tag{6}$$

Equations (5) and (6) can be combined to form a simplified expression for output signal z as follows:

$$z = y \cdot e^{A \cdot \ln y} = y \cdot e^{\ln y^A} = y \cdot y^A \tag{7}$$
$$z = y^{1+A}$$

Equation (7) can be transformed into its logarithmic or decibel equivalent and rewritten as follows:

$$\log z = (1+A) \log y \tag{8}$$

Upon comparing equations (4) and (8), it should be appreciated that the slopes of the logarithmic input-output characteristics thereof are in reciprocal relation. For example, when $A < 1$, the slope of the logarithmic input-output curve for compression circuit 7 is $\frac{1}{2}$ while the slope of the logarithmic input-output curve of expansion circuit 13 is 2.

It should further be appreciated that decoder circuit 3 reproduces exactly, at output terminal 12 thereof, the original information signal supplied to input terminal 4 of encoder circuit 2. More particularly, if equation (3) is substituted into equation (7), it is seen that:

$$z = \left( x = \frac{1}{1+A} \right)^{(1+A)} = x. \tag{9}$$

However, the above encoder or gain control circuit 2 needlessly compresses both high and low signal levels of the information signal, as shown by curve R in FIG. 3. In other words, high signal levels result in a sufficiently high signal-to-noise ratio so that there is no need to compress such signals. In comparison, when the signal level is of a relatively low value, the gain of variable gain amplifier 8 is of a relatively high value so that background noise is greatly amplified, resulting in a low signal-to-noise ratio. This results in a hissing sound in the reproduced signal which is particularly noticeable as the level of the signal varies. Accordingly, it is only necessary to compress low levels of the information signal to attenuate the background noise in relation to the low level signal while providing no compression to signal levels of a relatively high level.

Referring now to FIG. 6, there is shown an improved compression circuit 7 according to the prior art in which elements corresponding to those described above with reference to the compression circuit of FIG. 4 are identified by the same reference numerals. As shown therein, the pre-emphasized information signal from pre-emphasis circuit 6 (FIG. 1) is supplied to variable gain amplifier 8 from input terminal 21. As previously discussed in regard to FIG. 4, variable gain amplifier 8 produces a compressed output signal y at output terminal 22 thereof which is also supplied to a level detecting circuit 9. This latter circuit produces the control voltage which is supplied to variable gain amplifier 8 for varying the gain thereof. The control voltage from level detecting circuit 9 is supplied to variable gain amplifier 8 through a limiter circuit 28 which has no effect on the control voltage when the level thereof is below a predetermined value but which grounds the control voltage when the level thereof is greater than the predetermined value. In particular, limiter circuit 28 includes a PNP transistor 28b having its collector connected to ground and its emitter connected through a diode 28a to the output of level detecting circuit 9 and to the control voltage input of variable gain amplifier 8. The base of transistor 28b is connected to the movable top of a variable resistor 28c which is, in turn, connected to a voltage source. Thus, as the level of output signal y from variable gain amplifier 8 increases so that the control voltage from level detecting circuit 9 becomes greater than a predetermined value, diode 28a is turned ON so as to render transistor 28b conductive. As a result, the output from level detecting circuit 9 is grounded through diode 28a and the collector-emitter path of transistor 28b so that a control voltage at ground potential is supplied to variable gain amplifier 8. Since the input-output characteristic of variable gain amplifier 8 is represented by equation (1), it should be appreciated that, at such time when the control voltage supplied to variable gain amplifier 8 is at ground potential, variable gain amplifier 8 has a unity gain. In other words, the information signal is not compressed when the level thereof exceeds the predetermined value. However, when the level of the information signal is below the predetermined value, diode 28a is turned OFF so that variable gain amplifier 8 provides a compression effect to the low level information signals in response to the control voltage supplied thereto from level detecting circuit 9. The input-output characteristic for compression circuit 7 of FIG. 6 is shown by the solid line in FIG. 7. It is to be realized, of course, that, when the compression circuit of FIG. 6 is used in the input gain control circuit, an expansion circuit is provided on the output side of recording device 1 which has an input-output expansion characteristic which is complementary to the characteristic of compression circuit 7 shown in FIG. 7.

However, the above compression circuit 7 of FIG. 6 still poses various problems. For example, in addition to the need to adjust variable gain amplifier 8 to correctly respond to the control voltage supplied thereto, adjustment of the limit level of limiter circuit 28 and, more particularly, of variable resistor 28c, is also required. However, because of these two phases of adjustment, it is often difficult to obtain exact adjustment levels. This means that the level of output signal y may not always correctly correspond to the level of input signal x as shown in FIG. 7.

Figure 8:
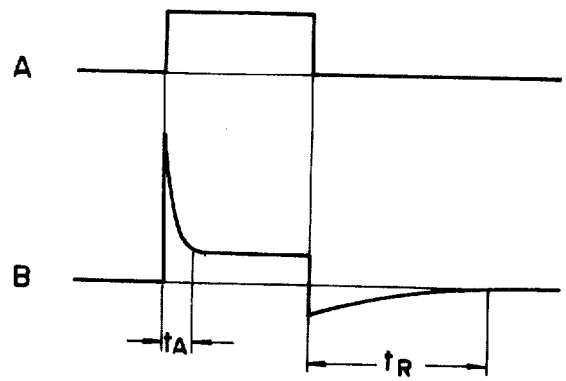
FIG. 8A is a waveform diagram illustrating changes in the signal level of an input information signal.
FIG. 8B is a waveform diagram illustrating changes in the level of the signal of FIG. 8A when transmitted through the recording circuits of FIGS. 1 and 6.

In addition, the compression and expansion circuits of FIGS. 4-6 exhibit a poor transient characteristic for changes in signal level. In particular, these circuits fail to adequately respond when the signal level is abruptly increased from a first low level to a second higher level. For example, when the level of an input signal is abruptly increased, as shown in FIG. 8A, an output signal y, as shown in FIG. 8B, is produced at output 22 of each of the compression circuits 7 of FIGS. 4 and 6. Thus, when the input signal level is increased, as shown by the positive-going edge in FIG. 8A, the resulting output signal has a corresponding overshoot portion which is substantially greater than the desired level of the output signal. The time within which this overshoot falls back to its desired level is termed the attack time $t_A$. However, it becomes difficult to choose a correct attack time $t_A$ since an attack time which is too long will distort the sound which is eventually reproduced and an attack time that is too short will result in a clicking noise in the reproduced sound. An optimum attack time $t_A$ is therefore set in the range of 100 $\mu$s to 10 ms. In like manner, when the input signal level falls from a high value to a low value as shown by the negative-going edge of the signal in FIG. 8A, a negative overshoot occurs and the time within which the level of the signal returns from the overshoot level to its desired level is termed the recovery time $t_R$. As shown in FIG. 8B, the recovery time $t_R$ is optimally set for a comparatively long time which is generally greater than 100 ms. It should be appreciated that the attack time $t_A$ and the recovery time $t_R$ result from the charging and discharging of a capacitor in the circuit. However, the setting of these response times $t_A$ and $t_R$ becomes difficult.

Further, overshoots as a result of increasing signal levels within the relatively short attack time $t_A$ may, for example, have a level which is 10 dB greater than the desired signal level. Such increase in signal level is, of course, undesirable and results in the occurrence of a distorted sound when reproduced from a magnetic tape. This distortion results because the magnetic tape is only designed to record, without distortion, signals up to a certain level. Above this level, the magnetic tape becomes saturated so that recording of signals above this level results in distortion of the reproduced sound.

Figure 7:
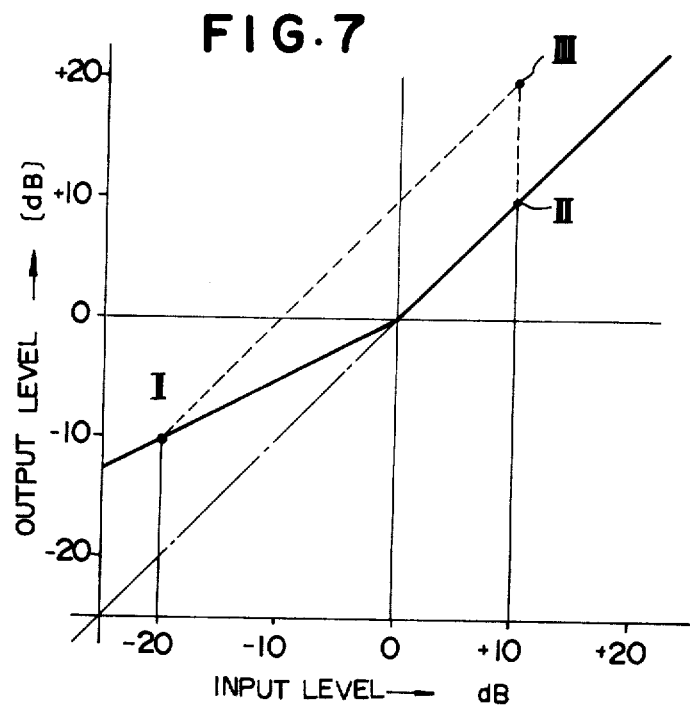
FIG. 7 is a graphical diagram illustrating the input-output level characteristic for the compression circuit of FIG. 6.

Referring now to FIG. 7, it is seen that if an input signal level changes from $-20$ dB to $+10$ dB, the output signal level changes from a point I on the solid line curve of FIG. 7 to a point II thereon. However, because the gain of variable gain amplifier 8 cannot instantaneously follow the above-described rapid signal level increase, the output signal level is first raised from point I to a point III, as represented by the broken line in FIG. 7. This results in the high level input signal being acted on for a short interval with a large gain from variable gain amplifier 8. Thereafter, the output signal level is slowly lowered from point III to point II within the attack time $t_A$ as the gain of amplifier 8 slowly decreases. It should therefore be appreciated that the utilization of a single signal path for signals above the aforementioned limit level and for signals below the aforementioned limit level may have a deleterious effect on the reproduced sound, as previously discussed.

Referring now to FIG. 9, there is shown one embodiment of a compression circuit 30 for a gain control circuit according to this invention. In this embodiment, the information signal is supplied to a pre-emphasis circuit 6 (FIG. 1) for pre-emphasizing the high frequency components of the signal. The pre-emphasized signal is then supplied to an input terminal 31a of compression circuit 30 (FIG. 9) where signal levels lower than a predetermined value are compressed and signal levels greater than the predetermined value are passed therethrough with substantially unity gain. In particular, compression circuit 30 includes a first transmission path including a variable gain amplifier 33, such as a voltage controlled amplifier, having its input connected to input terminal 31a through a resistor 32. A control circuit 34 supplies a control voltage to variable gain amplifier 33 for varying the gain thereof and includes a level detecting circuit 35 supplied with the output signal from variable gain amplifier 33 and a non-linear circuit 36 which produces the control voltage in response to the detected output signal from level detecting circuit 35. Non-linear circuit 36 has an input-output characteristic which, as shown in FIG. 10, has a first linear slope when the detected output signal from level detecting circuit 35 is less than a predetermined voltage $V_S$ and a second linear slope which is greater than the first linear slope when the level of the detected output signal is greater than the predetermined voltage $V_S$. In other words, the input-output characteristic of non-linear circuit 36 is of a "bent-linear" nature.

Therefore, if the input-output level characteristic of variable gain amplifier 33 is plotted, a "bent-linear" curve will also be exhibited, as shown by the broken line in FIG. 11. In this regard, the 0 dB reference level at which the broken line curve of FIG. 11 is bent, corresponds to the predetermined voltage $V_S$ of the detected output signal from level detecting circuit 35. As a result, the gradient of the input-output level curve of variable gain amplifier 33 for input levels less than 0 dB is 2. In other words, for such low levels of the input signal, a compression ratio of 2:1 is produced. However, for input levels greater than 0 dB, the gradient of the input-output level curve is less than the aforementioned gradient so that a compression ratio of n:1 is produced where n is greater than 2.

The output from variable gain amplifier 33 is transmitted through a resistor 37 to a diode limiter circuit 40 comprised of two diodes 38 and 39, each being connected between the output of resistor 37 and ground and each being arranged in opposing relation to the other. In other words, as shown in FIG. 9, the cathode of diode 38 and the anode of diode 39 are connected to the output of resistor 37 and the anode of diode 38 and the cathode of diode 39 are connected to ground. It should therefore be appreciated that for output levels of variable gain amplifier 33 greater than the positive limiting level L (FIG. 11) of limiting circuit 40, diode 39 is turned ON so as to connect this output to ground. In like manner, it should be realized that diode 38 acts to produce a negative limiting level for the output of variable gain amplifier 33. The output of variable gain amplifier 33 is thereby supplied through limiting circuit 40 and another resistor 41 to an input of an adder amplifier 42. Adder amplifier 42 is preferably an operational amplifier and the output from variable gain amplifier 33 is supplied to the inverting input of amplifier 42.

A second transmission path is connected in parallel with the first transmission path between input terminal 31a and the inverting input of adder amplifier 42 and is comprised of a single resistor 43 which provides a flat pass characteristic having a constant gain. In particular, and as shown in FIG. 11 by the dot-dash line therein, the input-output characteristic of the second transmission path has a gradient of 1 so as to transmit the information signal with substantially unity gain. Thus, the compressed information signal from the first transmission path of variable gain amplifier 33 and the information signal with substantially unity gain from the second transmission path through resistor 43 are both supplied to an input, preferably the inverting input, of operational amplifier 42.

As can readily be seen from the broken line and dot-dash line characteristics of FIG. 11, when the level of the input information signal is less than the 0 dB reference level, the compressed information signal from variable gain amplifier 33 of the first transmission path is much greater than the transmitted information signal from the second transmission path so that the compressed signal from variable gain amplifier 33 is effectively produced at the output of amplifier 42. In comparison, when the level of the input information signal is greater than the 0 dB reference level, the transmitted information signal through the second transmission path of resistor 43 is much greater than the compressed signal through variable gain amplifier 33 so that the transmitted signal from the second transmission path of resistor 43 is effectively produced at the output of amplifier 42. In other words, the output from the second transmission path of resistor 43 can effectively be ignored when the level of the information signal is less than the 0 dB reference level, and the compressed signal from variable gain amplifier 33 can effectively be ignored when the level of the information signal is greater than the 0 dB reference level. Accordingly, amplifier 42 adds the effective signals at such time to produce an effective composite input-output characteristic shown by the solid line in FIG. 11. It should be realized that this characteristic is substantially identical to the prior art characteristic shown in FIG. 7. Further, a feedback resistor 44 is connected between the output of amplifier 42 and the inverting input thereof for stabilizing the gain of amplifier 42.

It should be appreciated that the use of the first and second transmission paths substantially eliminates the problems inherent in the prior art apparatus previously discussed. For example, with the prior art compression circuit shown in FIG. 6, since the gain of variable gain amplifier 8 cannot change instantaneously with changes in the signal level, when a signal level having a low value is abruptly increased to a higher value, the high gain of amplifier 8 acting on the low level signal also acts on the abruptly increased higher level signal for a short time. This results, as previously discussed, in overshoots being formed in the signal which produce a deleterious effect on the sound reproduced from such signal recorded on a magnetic tape. However, the gain control circuit according to this invention, as shown in FIG. 9, substantially eliminates such adverse effects. Thus, when the level of the input signal changes from a low value, for example, below 0 dB, to a higher value above the 0 dB reference level, variable gain amplifier 33 produces an output signal having overshoots. However, since limiter circuit 40 is positioned outside of control circuit 34, the overshoots are effectively suppressed. In other words, when large overshoots from variable gain amplifier 33 are supplied to limiter circuit 40, diode 39 turns ON so as to ground such overshoots. However, since the output level is now greater than 0 dB, the adder amplifier 42 is effectively supplied with the information signal through the second transmission path of resistor 43. As a result, any distortion in the signals is substantially eliminated.

Figure 12:
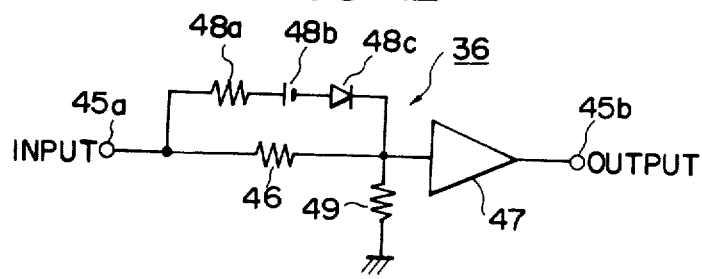
FIG. 12 is a circuit wiring diagram of a non-linear circuit that can be used in the compression circuit of FIG. 9.

Referring now to FIG. 12, there is shown one circuit arrangement that may be used for non-linear circuit 36 in the gain contaol circuit according to the present invention. As shown therein, the detected output signal from level detecting circuit 35 is supplied through an input terminal 45a and a resistor 46 to an amplifier 47. A series circuit comprised of a resistor 48a, a voltage source 48b for producing a voltage substantially equal to the predetermined voltage $V_S$ (FIG. 10) and having its positive terminal connected to resistor 48a, and a diode 48c having its anode connected to the negative terminal of voltage source 48b, is connected in parallel with resistor 46 between input terminal 45a and the input of amplifier 47. Further, the input of amplifier 47 is connected to ground through a resistor 49, and the output of amplifier 47 is connected to a terminal 45b which is, in turn, connected to the control input of variable gain amplifier 33. Thus, when the level of the information signal supplied to input terminal 45a is less than the predetermined voltage $V_S$, diode 48c is rendered inoperative so that a first voltage divider comprised of resistors 46 and 49 supplies a voltage divided signal to amplifier 47. However, when the level of the information signal supplied to input terminal 45a is greater than the predetermined voltage $V_S$, diode 48c is turned ON. This results in resistors 46 and 48a, which are in parallel, forming an equivalent resistance which forms a voltage divider circuit with resistor 49. Accordingly, the voltage-dividing ratio acting on the signal supplied to amplifier 47 changes so that the bent-linear input-output characteristic shown in FIG. 10 is obtained.

Figure 13:
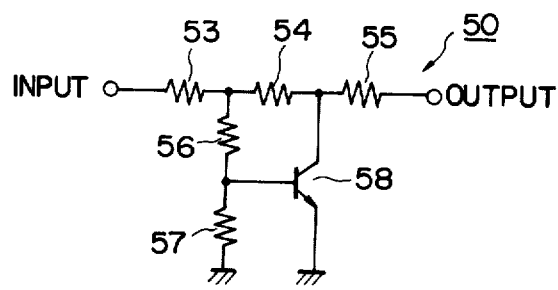
FIG. 13 is a circuit wiring diagram of a limiter circuit that can be used in the compression circuit of FIG. 9.

Although the limited circuit used in the embodiment of FIG. 9 is a diode limiter circuit 40, it should be appreciated that any equivalent limiter circuit may be substituted therefor. For example, as shown in FIG. 13, a transistor limiter circuit 50 may be used. In this circuit, three resistors 53, 54 and 55 are connected in series between an input terminal and output terminal of limiter circuit 50 and two resistors 56 and 57 are connected in series between a junction point of resistors 53 and 54 and ground. An NPN transistor 58 has its base connected to ground through resistor 57, its emitter connected directly to ground and its collector connected to a junction point between resistors 54 and 55. Thus, when the level of the information signal supplied from variable gain amplifier 33 of FIG. 9 to the input terminal of limiter circuit 50 is less than the predetermined voltage $V_S$, the voltage supplied to the base of transistor 58 is insufficient to turn the transistor ON. Accordingly, at such time, the compressed information signal from variable gain amplifier 33 is supplied through resistors 53, 54 and 55 to the inverting input of operational amplifier 42. However, when the level of the compressed information signal is greater than the predetermined voltage $V_S$, transistor 58 is turned ON so that the compressed information signal is grounded through the collector-emitter path of transistor 58.

Limiter circuits 40 and 50 have a relatively flat frequency characteristic, that is, a characteristic which is dependent only upon the level of the signal supplied thereto and not on the frequency of the signal. However, conventional magnetic tape used in audio signal recording and reproducing apparatus has a frequency characteristic whereby the maximum signal level which can be reproduced from the magnetic tape decreases at higher frequencies as a result of the saturation characteristic thereof. Since limiter circuits 40 and 50 have a flat frequency characteristic, that is, are not frequency dependent, the limiting levels thereof are set in conformance with the maximum output level which can be reproduced from the magnetic tape for high frequency signals. The signal levels of low and mid-frequency signals are thereby limited to a greater extent than necessary. In the case where a compromise is sought between the excessive limitation in the low and midfrequency ranges and the decreased limiting level for the high frequency range, the low and mid-frequency signals will still have their signal levels limited to an extent greater than necessary while signal levels in the high frequency range will not be sufficiently limited so that some saturation in this latter range will occur. Accordingly, it is desirable to have a limiter circuit which is frequency dependent in a complementary manner to the frequency characteristic of the magnetic tape utilized.

Figure 14:
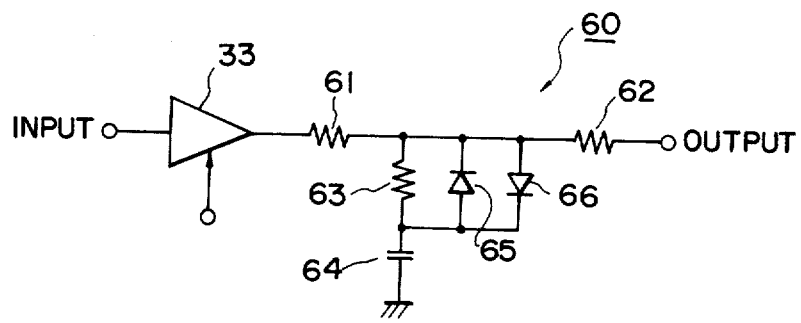
FIG. 14 is a circuit wiring diagram of another limiter circuit having a frequency dependency and which can be used in the compression circuit of FIG. 9.
Figure 15:
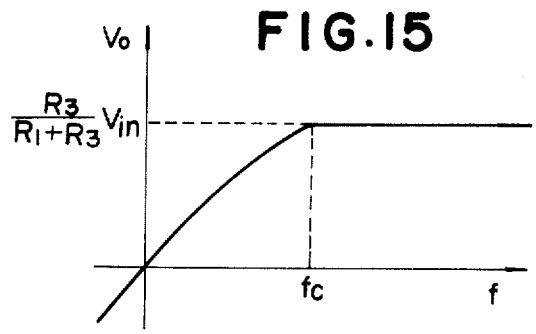
FIG. 15 is a graphical diagram illustrating the frequency characteristic of the limiter circuit of FIG. 14.

Referring now to FIG. 14, there is shown one embodiment of a limiter circuit 60 which can be substituted for limiter circuit 40 of FIG. 9 and which has a frequency characteristic corresponding to the saturation characteristic of a magnetic tape. As shown therein, resistors 61 and 62 are connected in series between the output of variable gain amplifier 33 and the output of limiting circuit 60 which, in turn, is connected to the inverting input of operational amplifier 42. A series circuit of a resistor 63 and a capacitor 64 is connected between a junction point of resistors 61 and 62 with ground. Two diodes 65 and 66 are each connected in parallel with resistor 63 and are arranged in opposing relation. In particular, the cathode of diode 65 and the anode of diode 66 are connected to the junction point between resistors 61 and 62 and the anode of diode 65 and the cathode of diode 66 are connected in common to the junction point between resistor 63 and capacitor 64. Given that the resistance values of resistors 61 and 63 are $R_1$ and $R_3$, respectively, and the capacitance value of capacitor 64 is C, a voltage $V_o$ applied across resistor 63 and, of course, across each of diodes 65 and 66, can be expressed as follows:

$$V_o = \frac{R_3}{R_1 + R_3 + \frac{1}{j\omega C}} \cdot V_{in} \qquad (10)$$

$$= \frac{j\omega C R_3}{1 + j\omega C(R_1 + R_3)} \cdot V_{in},$$

where $V_{in}$ is the voltage supplied to limiter circuit 60 from variable gain amplifier 33. It should, therefore, be appreciated that, at high frequencies, capacitor 64 is effectively shorted in the circuit so that diodes 65 and 66 operate in a substantially identical manner to limiter circuit 40 of FIG. 9. In other words and as shown on FIG. 15, a substantially flat frequency response is generated for high frequency signals above the frequency $f_c$, with the maximum value of the output signal from limiter circuit 60 being equal to $$\frac{R_3}{R_1 + R_3} \cdot V_{in}.$$

This latter value is, of course, equal to the cut-in voltage of either of diodes 65 and 66 depending on the polarity of input voltage $V_{in}$. In comparison, at low frequencies, capacitor 64 retains a charge whereby the junction point between resistor 63 and capacitor 64 is raised to a voltage greater than ground potential. This means that a higher level of input voltage $V_{in}$ is required to turn ON diode 66 so that the maximum output level from limiter circuit 60 which can be recorded on the magnetic tape is greater for low frequency signals. In a practical embodiment of the arrangement of FIG. 14, the frequency characteristic of the voltage developed across resistor 63, and consequently, across diodes 65 and 66, provides a substantially flat characteristic for high frequencies, whereas, at low frequencies below cut-off frequency $f_C$, where:

$$f_C = \frac{1}{2\pi C(R_1 + R_3)}, \qquad (11)$$

the voltage $V_o$ developed across resistor 63 falls at a rate of 6 dB/octave. It should be realized, however, that a predetermined limiting level may be provided for the low frequency signals which is different than that for the high frequency signals by merely connecting a resistor in parallel with capacitor 64.

Figure 16:
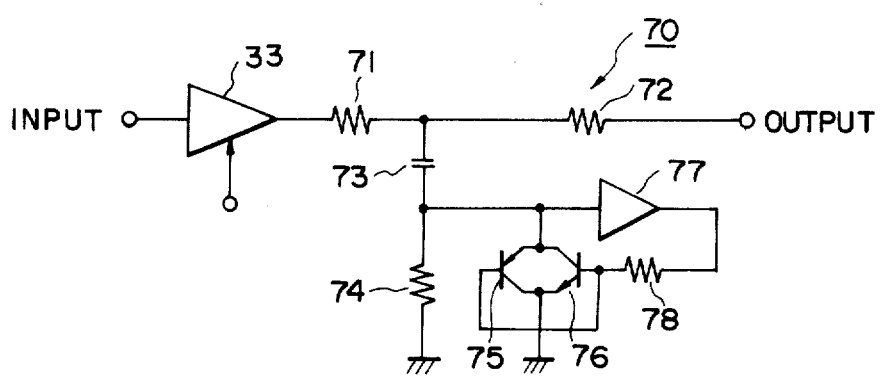
FIG. 16 is a circuit wiring diagram of yet another limiter circuit having a frequency dependency and which can be used in the compression circuit of FIG. 9.

Referring now to FIG. 16, there is shown another embodiment of a frequency dependent limiter circuit 70 which can be substituted for limiter circuit 40 (FIG. 9) and which has a frequency characteristic substantially identical to limiter circuit 60 of FIG. 14. As shown therein, resistors 71 and 72 are connected in series between the output of variable gain amplifier 33 and the output of limiter circuit 70. A capacitor 73 and a resistor 74 are connected in series between the junction of resistors 71 and 72 and ground, and a pair of transistors 75 and 76 each have their collector-emitter paths connected in parallel with resistor 74. In particular, transistor 75 is a PNP transistor and transistor 76 is an NPN transistor whereby the emitter of transistor 75 and the collector of transistor 76 are commonly connected to a junction point between capacitor 73 and resistor 74 and the collector of transistor 75 and the emitter of transistor 76 are connected in common to ground. Further, an amplifier 77 has its input connected to the junction point between capacitor 73 and resistor 74 and its output connected through a resistor 78 to the commonly connected bases of transistors 75 and 76. It should be appreciated that this circuit operates in a substantially identical manner to limiter circuit 60 of FIG. 14. In particular, at high frequencies, capacitor 73 is effectively shorted so that the signal from variable gain amplifier 33 is supplied across resistor 74 for turning ON one of transistors 75 and 76, depending on the polarity of the signal across resistor 74. When either of transistors 75 or 76 is turned ON, the output signal from variable gain amplifier 33 is grounded through the collector-emitter path thereof. However, at low frequencies, the level of the signal from variable gain amplifier 33 must be higher in order to supply the same operating voltage across resistor 74, due to the charging of capacitor 73. Accordingly, the maximum level of the input signal which is recorded on the magnetic tape is higher for low and mid-frequency signals than for high frequency signals.

Figure 17:
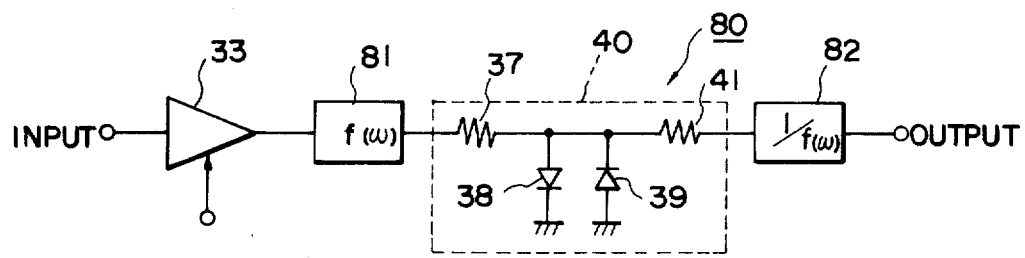
FIG. 17 is a block-circuit wiring diagram of a further limiter circuit having a frequency dependency and which can be used in the compression circuit of FIG. 9.

A further embodiment of a frequency dependent limiter circuit 80 is shown in FIG. 17. Limiter circuit 80 is comprised of a sub-limiter circuit 40 identical to the limiter circuit of FIG. 9 and which has a substantially flat frequency characteristic. A first filter circuit 81 is interposed between variable gain amplifier 33 and the input of sub-limiter circuit 40 and has a frequency characteristic f(ω) and a second filter circuit 82 is supplied with the output from sub-limiter circuit 40 and has a frequency characteristic 1/f(ω) which is the reciprocal or inverse of the frequency characteristic of filter circuit 81. In this manner, filter circuits 81 and 82 are designed to have a desired frequency characteristic which, in conjunction with limiter circuit 40 of FIG. 17, provides an effective frequency dependent limiter circuit 80.

Referring now to FIG. 18, there is shown one embodiment of an expansion circuit 90 for a gain control circuit according to this invention which can be used in place of the expansion circuit 13 of FIG. 1 and which has an input-output characteristic complementary to that of compression circuit 30 of FIG. 9. In other words, expansion circuit 90 provides an expansion characteristic to the reproduced encoded signal which is the reverse of the characteristic inparted by compression circuit 30 of FIG. 9 so as to return the encoded signal to its original form.

In particular, a reproduced encoded signal which is recorded on a recording medium, such as a magnetic tape, is fed by transducers or the like to an input terminal 91a of expansion circuit 90. This signal is further transmitted through a resistor 92 to an output terminal 91b of expansion circuit 90 through first and second transmission paths. The first transmission path includes a variable gain amplifier 93 supplied at its input terminal with the encoded signal from input terminal 91a through resistor 92 and a diode coring or limiter circuit 100. This latter circuit is comprised of a pair of diodes 101 and 102 which are connected in a parallel combination in opposing relation between resistor 92 and variable gain amplifier 93. A resistor 103 is connected between the input of variable gain amplifier 93 and ground. Thus, diode limiter circuit 100 limits the level of the reproduced encoded signal supplied thereto at two independent levels and provides a characteristic opposite to that of limiter circuit 40 of FIG. 9. For example, if diodes 101 and 102 are of identical construction and have a cut-in voltage level of 0.7 volts, the reproduced encoded signal from terminal 91a is supplied to variable gain amplifier 93 only when the level of this signal is above 0.7 volts (through diode 102) or less than −0.7 volts (through diode 101).

The first transmission path further includes a control circuit 94 for supplying a control voltage to variable gain amplifier 93 for varying the gain thereof. Control circuit 94 includes a level detecting circuit 95 supplied with the reproduced encoded signal from input terminal 91a and which, in turn, supplies a detected output signal to a non-linear circuit 96 also of control circuit 94. An amplifier 97 having a gain of −1, that is, an inverter, is supplied with the output from non-linear circuit 96 and produces the control voltage which is supplied to variable gain amplifier 93. It should be appreciated that control circuit 94, along with variable gain amplifier 93, acts on the reproduced encoded signal in a manner substantially complementary to the corresponding variable gain amplifier 33 and control circuit 34 of FIG. 9. The output from variable gain amplifier 93 is supplied to an inverting amplifier 104 through a resistor 98.

The second transmission path is comprised of a negative feedback resistor 105 supplied with the expanded inverted signal from amplifier 104 and which transmits this signal with a substantially flat pass characteristic, that is, with substantially unity gain, to the input of the first transmission path and, more particularly, to limiter circuit 100 thereof. More particularly, resistor 105 is connected between the output side of resistor 92 and the output of inverting amplifier 104. Thus, the encoded signal supplied through the first transmission path is inverted by amplifier 104 and this inverted signal is fed back to the first transmission path so as to reproduce the original information signal that had previously been supplied to compression circuit 30 of FIG. 9. A feedback resistor 106 is also connected between the input and output terminals of inverting amplifier 104 for adjusting the gain thereof. Further, the output gain control or decoder circuit according to this invention includes a de-emphasis circuit, such as circuit 14 shown in FIG. 1, which is connected to either the input or output terminal 91a to 91b of expansion circuit 90 for providing a characteristic complementary to the pre-emphasis circuit in the input gain control or encoder circuit according to this invention. In other words, the de-emphasis circuit attenuates the high frequency components of the encoded signal.

Referring now to FIGS. 19 and 20, the principle of operation of the gain control circuit will now be discussed in relation to FIGS. 19A and 19B. Referring first to FIG. 19A which illustrates an encoder circuit 110 according to this invention and which is representative, for example, of compression circuit 30 of FIG. 9, an input information signal x is supplied to an input terminal 111a of encoder circuit 110. This signal is then supplied through a first transmission path 113 which acts on the signal with a transmission function $\beta$ and through a second transmission path 112 which acts on the signal with a transmission function $\alpha$. The signals transmitted through the two transmission paths 112 and 113 are added in an adding circuit 114 and this added signal is supplied as an output signal y to an output terminal 111b of encoder circuit 110. It should be realized, of course, that in relation to the circuit of FIG. 9, first transmission path 113 includes variable gain amplifier 33 and control circuit 34 which comprises the input information signal and second transmission path 112 is comprised of resistor 43 which transmits the information signal with substantially unity gain. Thus, output signal y from adding circuit 114 can be represented as follows:

$$y = (\alpha + \beta) x \qquad (12).$$

A decoder circuit 115 according to this invention is shown in FIG. 19B. In particular, encoded signal y from output terminal 111b of encoder circuit 110 is supplied to an input terminal 116a of decoder circuit 115. This signal is then supplied to a positive input terminal of an adding circuit 117 which, in turn, transmits the signal to an output terminal 116b of decoder circuit 115 through a first transmission path 118 having a transmission function $1/\beta$ which is the reciprocal of the function of first transmission path 113 of encoder circuit 110. This results in an output signal z being supplied to output terminal 116b of decoder circuit 115 and also a negative input terminal of adding circuit 117 through a second transmission path 119 having a transmission function $\alpha$. Accordingly, an output signal z is produced at output terminal 116b which can be represented as follows:

$$z = 1/\beta (y - \alpha z) \qquad (13)$$

Equation (12) may be substituted in equation (13), as follows:

$$z = 1/\beta [(\alpha + \beta) x - \alpha z] \quad (14)$$

$$\beta z = (\alpha + \beta) x - \alpha z$$

$$(\alpha + \beta) z = (\alpha + \beta) x$$

$$z = x.$$

In other words, the information singal which had previously been subjected to compression in encoder circuit 110 is returned to its original form by decoder circuit 115 which provides a complementary expansion to the encoded signal. It should be noted, however, that in order to obtain complementary characteristics between compression circuit 30 (encoder circuit 110) and expansion circuit 90 (decoder circuit 115), the resistance value of resistor 43 (FIG. 9) should be equivalent to the resistance value of resistor 105 (FIG. 18) and the gain characteristic of variable gain amplifier 33 (FIG. 9) should be equal and opposite to that of variable gain amplifier 93 (FIG. 18).

It should be appreciated that the inverse or reciprocal transmission function $1/\beta$ of transmission path 118 (FIG. 19B) can be obtained by utilizing the circuitry of encodedr circuit 110 (FIG. 19A). For example, a negative feedback circuit 122 (FIG. 20) may include an operational amplifier 121 having the encoded signal y supplied to its non-inverting input. The output from operational amplkifier 121 is supplied to the inverting input thereof in a negative feedback loop through a transmission path 120 having a transmission function $\beta$, where transmission path 120 is equivalent to transmission path 113 of FIG. 19A. If the gain of operational amplifer 121 is $\alpha$, the transmission function G of negative feedback circuit 122 can be represented as follows:

$$G = \frac{\alpha}{1 + \alpha\beta} \quad (15)$$

If the values of $\alpha$ and $\beta$ are chosen so that $\alpha\beta > 1$, then transmission function G can be represented as follows:
$$G = 1/\beta \quad (16)$$

In this manner, the reciprocal or inverse transfer function $1/\beta$ for transmission path 118 of FIG. 19B is obtained by utilizing circuitry similar to that of encoder circuit 110.

It should therefore be appreciated that the gain control circuit according to the present invention provides distinct advantages over the gain control circuitry according to the prior art. For example, by providing two transmission paths and a 0 dB reference level at which the effect of the two transmission paths on the compression and expansion characteristics of compression circuit 30 and expansion circuit 90 changes, respectively, it is only necessary to adjust variable gain amplifiers 33 and 93, respectively, without the necessity of further adjusting a variable resistor 28c (FIG. 6) as required by the prior art. Further, by providing limiter circuits 40, 50, 60, 70 or 80 at the output of variable gain amplifier 33 and coring or limiter circuit 100 at the input of variable gain amplifier 93, any overshoots in the compressed signal are effectively suppressed so as to substantially eliminate any adverse effects from saturation of a magnetic tape. It should be appreciated that compression and expansion of the level of an information signal are thus performed in a desired manner while saturation of a magnetic tape is prevented and any spectral components in the low frequency range of the information signal, which would normally be generated as a result of such saturation, are substantially eliminated or reduced.

Referring now to FIG. 21, there is shown another embodiment of an input gain control or encoder circuit 130 according to the present invention. In this embodiment, an information signal is supplied through an input terminal 131a and a pre-emphasis circuit 132 to encoder circuit 130 comprised of three transmission paths. Pre-emphasis circuit 132 pre-emphasizes the high frequency components of the information signal supplied thereto in much the same manner as pre-emphasis circuit 6 of FIG. 1.

Encoder circuit 130 includes a first transmission path comprised of a compression circuit 137 having a variable gain amplifier 135, such as an operational amplifier, and a control circuit 136 varying the gain of amplifier 135. Variable gain amplifier 135 is supplied with the pre-emphasized signal from pre-emphasis circuit 132 through a resistor 141, for example, at its inverting input. Control circuit 136 includes a weighting circuit 143 supplied with the output from variable gain amplifier 135 and which weights the signal supplied thereto in accordance with the frequency of the signal. For example, weighting circuit 143 may be comprised of a high pass filter which weights the high frequency spectrum of the signal. The output of weighting circuit 143 is supplied to a level detecting circuit 144 which detects the level of the signal from weighting circuit 143 and which may, for example, be comprised of a full wave rectifier for rectifying or smoothing the signal. A non-linear circuit 145 is supplied with the output from level detecting circuit 144 for non-linearly converting the level detected output signal and producing a control voltage for varying the gain of amplifier 135. More particularly, a negative feedback resistor 142, such as a CdS photoconductive cell, is connected between the output and inverting inputs of variable gain amplifier 135, and a light emitting element (not shown), such as a light emitting diode, emits light in accordance with the control voltage from non-linear circuit 145 for irradiating negative feedback resistor 142. In this manner, depending on the level of the control signal from non-linear circuit 145, the resistance value of negative feedback resistor 142 is varied so as to vary the gain of variable gain amplifier 135.

The output from variable gain amplifier 135 is supplied to a limiter circuit 138 which limits the level of the output from variable gain amplifier 135. In limiter circuit 138, a resistor 148 is connected in parallel with a series combination of a capacitor 149 and a resistor 150 and this parallel combination is connected between the output of variable gain amplifier 135 and the inverting input of an operational amplifier 147. A resistor 151, a first diode 152 and a second diode 153 are each connected in parallel with each other and are connected between the input and output terminals of operational amplifier 147 with diodes 152 and 153 being arranged in opposing relation. It should be appreciated that diodes 152 and 153 perform the same function as diodes 38 and 39 of the embodiment of FIG. 9 and resistor 151 is a negative feedback resistor for stabilizing the gain of amplifier 147. Limiter circuit 138 further includes an operational amplifier 155 supplied with the output from amplifier 147 at its non-inverting input through a resistor 154. The non-inverting input of amplifier 155 is further connected to ground through a capacitor 161 and resistor 162 and a negative feedback resistor is connected between the output of amplifier 155 and the inverting input thereof for stabilizing the gain of the amplifier. It should be appreciated that the output from limiter circuit 138 is substantially identical to the output from limiter circuit 40 of FIG. 9. In other words, the output signal from limiter circuit 138 which has been compressed in compression circuit 137 is limited in level by limiter circuit 138. The output from limiter circuit 138 is supplied through a resistor 156 to the inverting input of an operation amplifier 157.

The second transmission path is comprised of a resistor 134 supplied with the output from pre-emphasis circuit 132 and providing a signal having a substantially flat pass characteristic, that is, the information signal with substantially unity gain, which is also supplied to the inverting inputof operational amplifier 157. Thus, the second transmission path comprised of resistor 134 operates in a substantially identical manner to the second transmission path of FIG. 9 comprised of resistor 43. The first and second transmission paths are connected in parallel with each other and the respective signals therefrom are added at the input of operational amplifier 157 in much the same manner as previously described in regard to amplifier 42 of FIG. 9. Operational amplifier 157 further has a resistor connected between the output and inverting input thereof for stabilizing the gain of the amplifier. The added signal is inverted by amplifier 157 and supplied to the inverting input of an operational amplifier 159 through a resistor 158.

The third transmission path is comprised of a high pass filter 133 supplied with the output from pre-emphasis circuit 132. High pass filter 133 transmits the high frequency components of the pre-emphasized signal to the inverting input of operational amplifier 159. It should therefore be appreciated that, since the added signal from the fist and second transmission paths is inverted by operational amplifier 157, this added signal is subtracted from the transmitted signal from high pass filter 133 at the inverting input of operational amplifier 159. The resulting signal is further inverted by amplifier 159 and supplied to output terminal 131b of encoder circuit 130. A negative feedback resistor is connected between the output and input terminals of amplifier 159 for stabilizing the gain thereof.

In other words, as shown in FIG. 22, the output from pre-emphasis circuit 132 is supplied through a first transmission path comprised of compression circuit 137 and limiter circuit 138 and through a second transmission path comprised of resistor 134 and the output signals from the first and second transmission paths are added in an adding circuit 139 to produce an added output signal. Further, the pre-emphasized signal from pre-emphasis circuit 132 is supplied through a third transmission path comprised of high pass filter 133 where it is effectively subtracted from the added output signal from adding circuit 139 in a second adding circuit 140 and the resultant signal is supplied to output terminal 131b. It should be realized that the use of an adding circuit 140 in FIG. 22 in which the signal from the third transmission path is supplied to a negative input thereof and the combined signal from the first and second transmission paths is supplied to a positive input thereof is equivalent to the circuit of FIG. 21 comprised of amplifiers 157 and 159.

Figure 23:
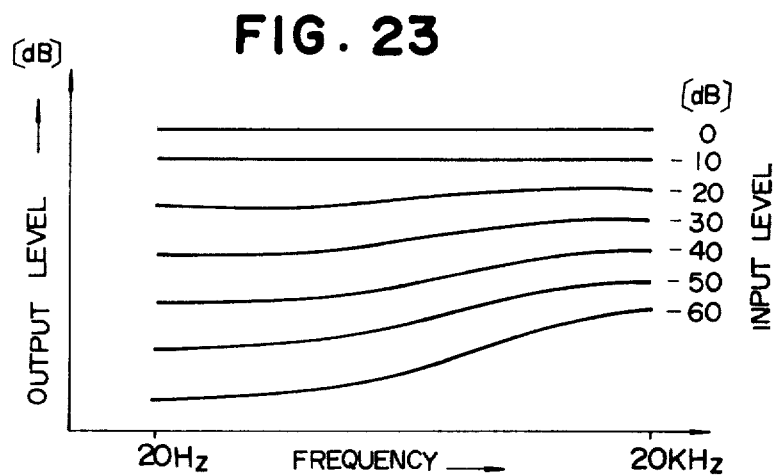
FIG. 23 is a graphical diagram illustrating the variable pre-emphasis frequency characteristic of the gain control circuit of FIG. 21.

It should be appreciated that, as a result of the arrangement of the circuit of FIG. 21, a frequency characteristic, as illustrated in FIG. 23, is attained. In particular, when the input information signal supplied to terminal 131a is of a relatively high value, the gain of the first and second transmission paths comprised of compression circuit 137 and resistor 134, respectively, is only slightly greater than the gain of the third transmission path comprised of high pass filter 133. However, when the input information signal is of a relatively high level, the addition of the signals from the first and second transmission paths has a relatively flat characteristic due to the predominance of the second transmission path over the first transmission path. Since pre-emphasis circuit 132 pre-emphasizes the high frequency components of the information signal, the resulting signal through the second transmission path, that is, through resistor 134, has the high frequency components thereof emphasized. The third transmission path comprised of high pass filter 133 only passes the high frequency components of the pre-emphasized information signal and the output from high pass filter 133 is effectively subtracted from the information signal transmitted through resistor 134 which also has the high frequency components of the signal pre-emphasized. The resulting signal at output terminal 131b therefore has a substantially flat frequency characteristic as shown by the 0 dB input level on FIG. 23.

In comparision, when the level of the input information signal is of a relatively low value, the gain across the first and second transmission paths is more than 30 dB greater than the gain across the third transmission path so that the signal from high pass filter 133 can effectively be ignored. At low signal levels, the first transmission path comprised of compression circuit 137 and limiter circuit 138 predominates over the second transmission path comprised of resistor 134 so that the signal supplied to output terminal 131b has its level compressed as a result of compression circuit 137 and the high frequency components pre-emphasized as a result of pre-emphasis circuit 132 as shown, for example, by the −60 dB input level on FIG. 23. This result is consistent with the objects of the present invention. In particular, the present invention is designed to improve the signal-to-noise ratio of the information signal. Since background noise is more predominant at low input levels than at high input levels and since background noise is of a relatively high frequency, the low level, high frequency components of the information signal are emphasized in comparison to the low level, low frequency components as shown, for example, at the −60 dB input level on FIG. 23. This results in the low level, high frequency components providing a relatively high signal-to-noise ratio when recorded on a magnetic tape.

Figure 24:
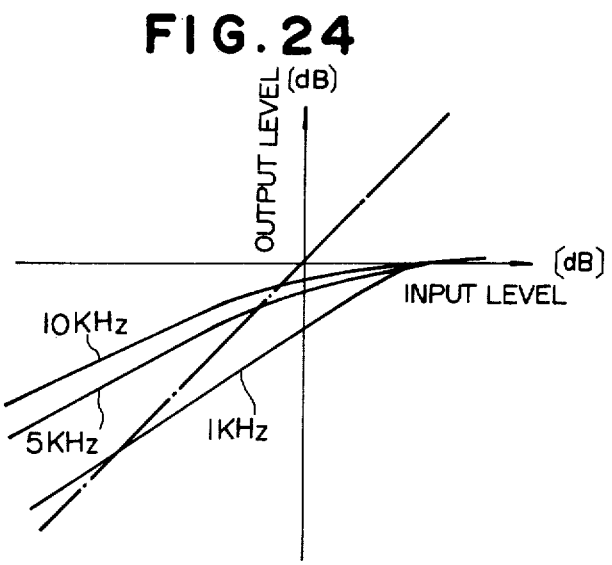
FIG. 24 is a graphical diagram illustrating the input-output characteristic of the compression circuit of the gain control circuit of FIG. 21.

It should be appreciated that the first and second transmission paths of FIG. 21 operate in a substantially identical manner to encoder circuit 30 of FIG. 9. Thus, for example, the first transmission path comprised of compression circuit 137 and limiter circuit 138 has an input-output characteristic as shown by the solid lines in FIG. 24 for frequencies of 1 KHz, 5 KHz and 10 KHz, in each of which the bent-linear input-output characteristic shown therein is essentially dependent on the non-linear characteristic of non-linear circuit 145. In addition, the second transmission path provides a substantially flat pass characteristic which transmits the information signal with substantially unity gain as shown by the dot-dash line in FIG. 24.

Figure 25:
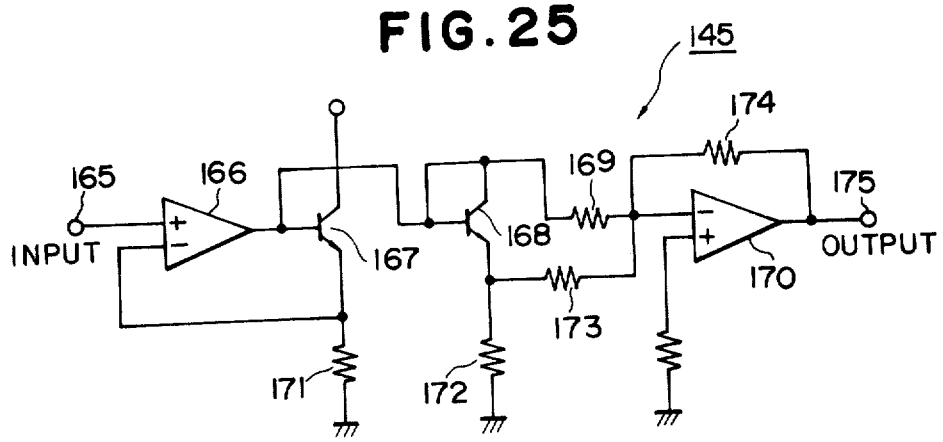
FIG. 25 is a circuit wiring diagram of a non-linear circuit included in the compression circuit of FIG. 21.

Referring now to FIG. 25, there is shown one particular circuit arrangement that may be used as the non-linear circuit 145 according to the present invention. In the circuit 145 of FIG. 25, a level detected DC voltage from level detecting circuit 144 (FIG. 21) is supplied through an input terminal 165 to the non-inverting input of an operational amplifier 166, the output of which is connected to the bases of NPN transistors 167 and 168, to the collector of transistor 168 and to the inverting input of an operational amplifier 170 through a resistor 169. The collector of transistor 167 is supplied with a voltage from a voltage source and the emitter thereof is connected to ground through a resistor 171 and to the inverting input of operational amplifier 166. The emitter of transistor 168 is connected to ground through a resistor 172 and to the inverting input of operational amplifier 170 through a resistor 173. Further, the non-inverting input of operational amplifier 170 is connected to ground through a resistor and a negative feedback resistor 174 connects the output of operational amplifier 170 to the inverting input thereof.

Figure 26:
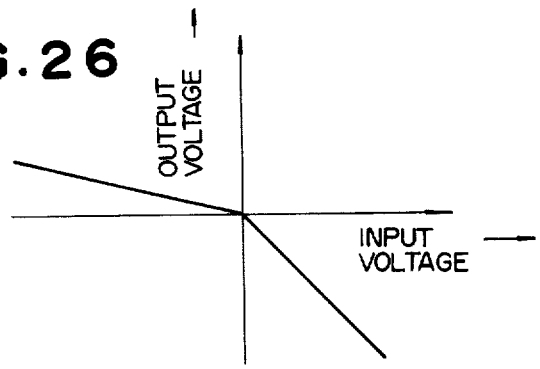
FIG. 26 is a graphical diagram illustrating the input-output characteristic of the non-linear circuit of FIG. 25.

Thus, when the level of the detected output signal supplied to input terminal 165 is less than a predetermined value, transistors 167 and 168 are rendered inoperative so that the output of operational amplifier 166 is supplied to the inverting input of amplifier 170 through resistor 169 only. However, when the level of the signal supplied to input terminal 165 is greaater than the predetermined value, transistors 167 and 168 are turned ON and the output from amplifier 166 is supplied to the inverting input of amplifier 170 through the parallel combination of resistors 169 and 173 so as to vary the gain of variable gain amplifier 135. As a result of such operation, a bent-linear input-output characteristic as shown in FIG. 26 is obtained. It should be appreciated that, as a result of the inverting nature of amplifier 170, the bent-linear input-output characteristic of FIG. 26 is inverted with respect to the input-output characteristic shown in FIG. 10. However, the characteristic of FIG. 26 may be inverted to correspond to the characteristic of FIG. 10 by arranging operational amplifier 170 to provide the resultant output signal at output terminal 175 of non-linear circuit 145 in non-inverted form.

Figure 27:
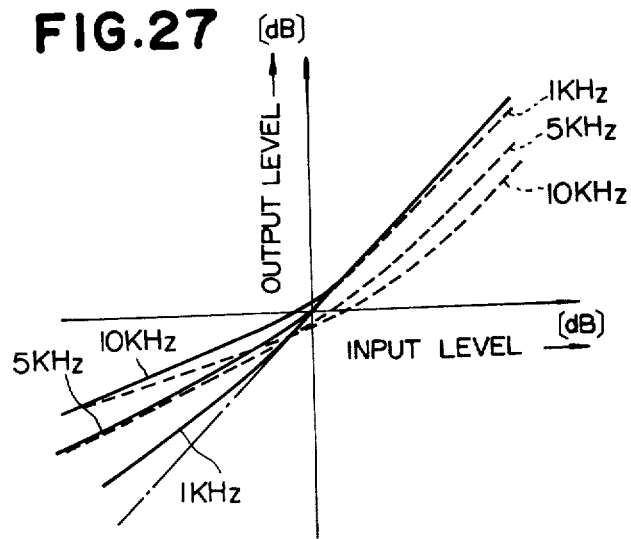
FIG. 27 is a graphical diagram illustrating the input-output level characteristic of the gain control circuit of FIG. 21.

As previously discussed in regard to the first embodiment of FIG. 9, and as applied to the embodiment of FIG. 21, limiter circuit 138 limits the output level of compression circuit 137 without affecting the input-output characteristic of compression circuit 137. Therefore, the input-output characteristic for the first and second transmission paths can be represented by the solid line curves of FIG. 27 for frequencies of 1 KHz, 5 KHz and 10 KHz. The resultant input-output characteristic between input terminal 131a and output terminal 131b of encoder circuit 130 as a result of all three transmission paths can be obtained, as shown by the corresponding broken lines of FIG. 27 by subtracting the output from the third transmission path from the output from the first and second transmission paths. Thus, as the level of the information signal in the high frequency range increases, the level of the output signal at output terminal 131b also increases but at a decreasing rate.

Figure 28:
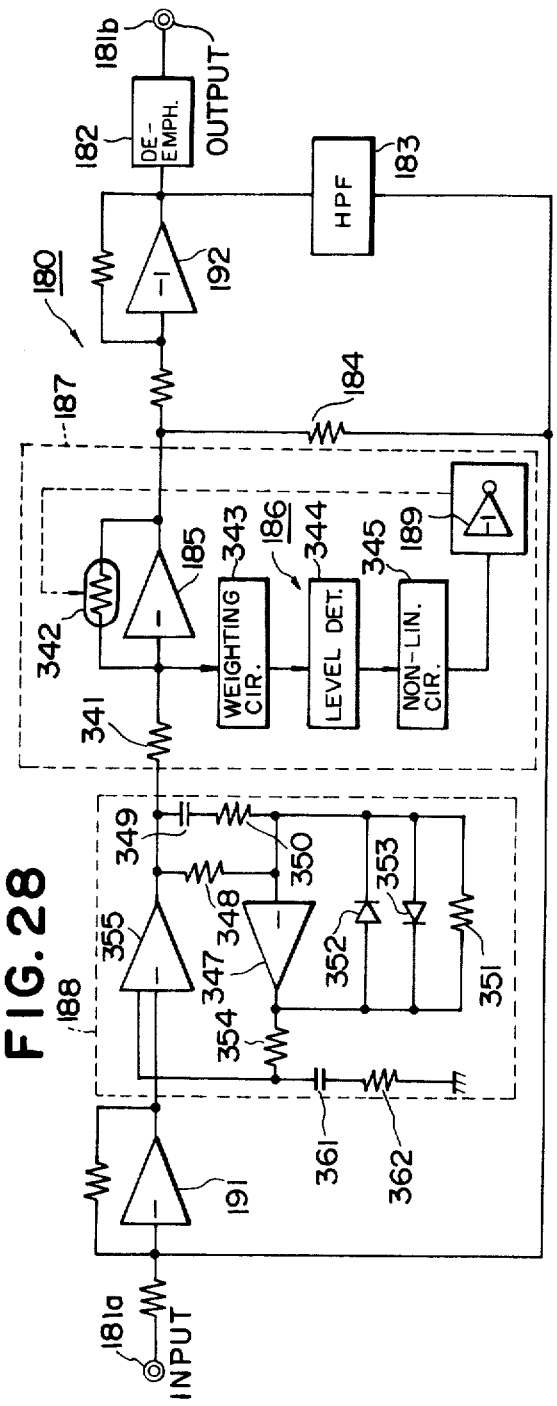
FIG. 28 is a block-circuit wiring diagram of another embodiment of an output gain control circuit according to the present invention having a characteristic complementary to the input gain control circuit of FIG. 21.

Referring now to FIG. 28, there is shown a second embodiment of a decoder circuit 180 according to this invention which provides a complementary characteristic to encoder circuit 130 of FIG. 21. In other words, decoder circuit 180 acts to restore the encoded signal to its original state. As shown therein, decoder circuit 180 includes three transmission paths, that is, a first transmission path comprised of an expansion circuit 187 and a limiter or coring circuit 188, a second transmission path comprised of a resistor 184 in parallel with the first transmission path and a third transmission path comprised of a high pass filter 183.

The encoded signal at input terminal 181a of decoder circuit 180 is supplied to the inverting input of an operational amplifier 191 through a resistor. The output from operational amplifier 191 is supplied to the first transmission path which is comprised of a limiter or coring circuit 188 followed by an expansion circuit 187. Limiter circuit 188 includes an operational amplifier 355 having an inverting input thereof supplied with the output from amplifier 191. The non-inverting input of amplifier 355 is connected to ground through a capacitor 361 and resistor 362. The output from operational amplifier 355 is supplied to the inverting input of another operational amplifier 347 through a resistor 348 and also through a series combination of a capacitor 349 and resistor 350 in which the latter series combination is in parallel with resistor 348. A resistor 351, a first diode 352 and a second diode 353 are connected in parallel with each other and are each connected between the inverting input and output terminals of operational amplifier 347, with diodes 352 and 353 being arranged in opposing relation. The output of operational amplifier 347 is supplied to the non-inverting input of amplifier 355 through a resistor 354.

It should be appreciated that the coring function of limiter circuit 188 can be obtained by utilizing the principles of the negative feedback loop of FIG. 20. In other words, limiter circuit 138 of FIG. 21 may be transformed into a negative feedback loop by supplying the output of amplifier 191 to the inverting input of amplifier 155 and supplying the output from operational amplifier 155 to the inverting input of amplifier 147 through resistor 148 which is in parallel with the series combination of capacitor 149 and resistor 150. This result may be attained by a relatively simple switching mechanism (not shown).

The expansion circuit 187 of the first transmission path is shown to include an operational amplifier 185 supplied at its inverting input with the output from amplifier 355 through a resistor 341. The output from operational amplifier 355 is also supplied to a weighting circuit 343 through resistor 341 and the output of weighting circuit 343 is supplied to a level detecting circuit 344. A non-linear circuit 345 receives the detected output signal from level detecting circuit 344 and supplies a control voltage through an inverter 189 to a light-emitting element (not shown), such as a light emitting diode. The light emitting element transmits light to a negative feedback resistor 342 connected between the output and inverting input terminals of operational amplifier 185 and which may be a CdS photoconductive cell having a resistance value which varies when irradiated by light from the light emitting element. The constructions of weighting circuit 343, detecting circuit 344, and non-linear circuit 345 are substantially identical to their respective counterpart circuits in FIG. 21. It should, therefore, be appreciated that, as the resistance value of negative feedback resistor 342 changes, the gain of operational amplifier 185 and consequently, of expansion circuit 187, also changes. It should further be appreciated that the input-output characteristic of the first transmission path comprised of coring circuit 188 and expansion circuit 187 is the inverse or reciprocal of the input-output characteristic of the first transmission path of FIG. 21.

The output from expansion circuit 187 is supplied through the second transmission path comprised of resistor 184 to the inverting input of operational amplifier 191. Further, the output from expansion circuit 187 is supplied to the inverting input of an operational amplifier 192 through a resistor and the inverted output signal from amplifier 192 is supplied to the inverting input of operational amplifier 191 through the third transmission path comprised of high pass filter 183 having a frequency characteristic substantially identical to the frequency characteristic of high pass filter 133 of FIG. 21.

Figure 29:
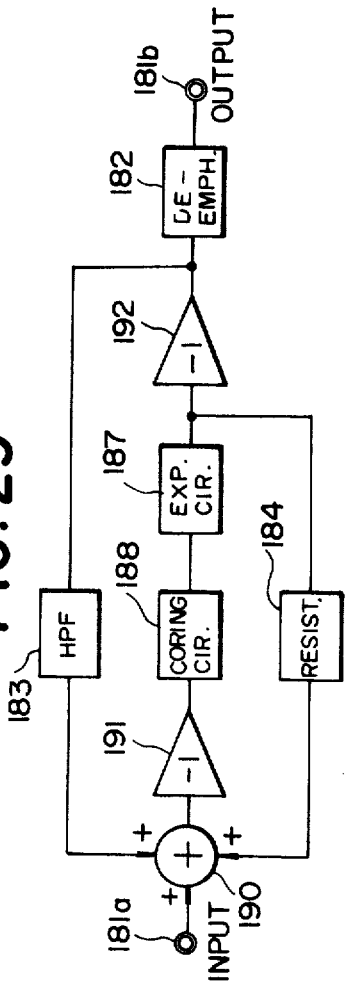
FIG. 29 is a block diagram to which reference will be made in explaining the operation of the output gain control circuit of FIG. 28.

In other words, as illustrated in FIG. 29, the encoded signal from input terminal 181a is effectively added in an adding circuit 190 to the output of the second transmission path comprised of resistor 184 which supplies a substantially flat pass characteristic and to the output of high pass filter 183 of the third transmission path. The added signals are supplied to the inverting input of operational amplifier 191 which performs an inverting function and the inverted signals are then supplied to the first transmission path, and, more particularly, to coring circuit 188 and expansion circuit 187 thereof. The output from expansion circuit 187 is inverted by inverting operational amplifier 192 and supplied to a de-emphasis circuit 182 which de-emphasizes the high frequency components of the signal supplied thereto in a manner substantially complementary to pre-emphasis circuit 132 of FIG. 21 so as to restore the information signal to its original form whereby it is supplied to output terminal 181b of decoder circuit 180.

Figure 30:
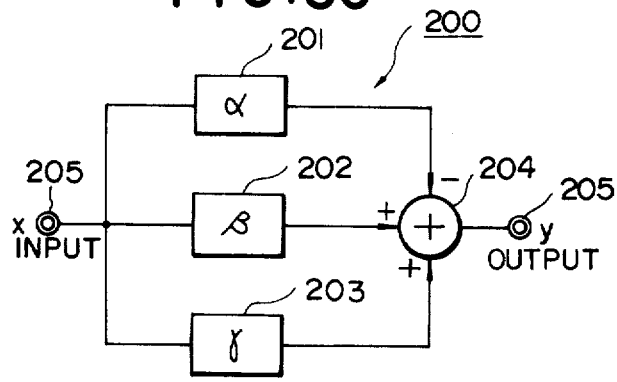
FIG. 30 is a block diagram to which reference will be made in explaining the operation of the input gain control circuit of FIG. 21.

The basic relationship between encoder circuit 130 (FIG. 21) and decoder circuit 180 (FIG. 28) will now be discussed in relation to FIGS. 30 and 31, with FIG. 30 corresponding to encoder circuit 130 and FIG. 31 corresponding to decoder circuit 180. As shown in FIG. 30, an encoder circuit 200 is supplied at its input terminal 205 with an information signal x. This information signal is supplied to respective adding inputs of an adding circuit 204 through a first transmission path 203 having a transmission function $\gamma$ and through a second transmission path 202 having a transmission function $\beta$ in which the first transmission path corresponds to the first transmission path of FIG. 21 comprised of compression circuit 137 and limiter circuit 138 and the second transmission path 202 corresponds to the second transmission path of FIG. 21 comprised of resistor 134. Input information signal x is also supplied to a subtracting input of adding circuit 204 through a third transmission path 201 having a transmission function $\alpha$ and which corresponds to the third transmission path of FIG. 21 comprised of high pass filter 133. Accordingly, the encoded output signal y of decoder circuit 200 at output terminal 205 thereof can be represented as follows:

$$y = (-\alpha + \beta + \alpha) x \quad (17)$$

Figure 31:
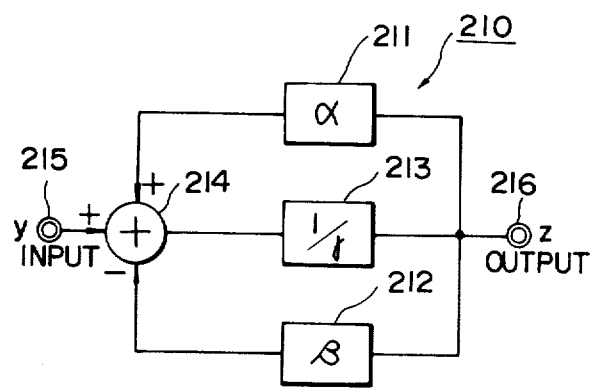
FIG. 31 is a block diagram to which reference will be made in explaining the complementary output characteristic of the gain control circuit of FIG. 28.

Referring now to FIG. 31, there is shown a decoder circuit 210 having a complementary characteristic to encoder circuit for restoring encoded information signal y to its original form. Encoded information signal y is supplied through an input terminal 215 of decoder circuit 210 to an adding input of an adding circuit 214 thereof. The output from adding circuit 214 is supplied through a first transmission path 213 having a transmission function $1/\gamma$ which is the reciprocal or inverse of the characteristic of first transmission path 203 of encoder circuit 200. The output from first transmission path 213 is supplied to a subtracting input of adding circuit 214 through a second transmission path 212 having a transmission function $\beta$ and to a second adding input of adding circuit 214 through a third transmission path 211 having a transmission function $\alpha$. It should be appreciated that the first, second and third transmission paths of decoder circuit 210 correspond to the first, second and third transmission paths of decoder circuit 180 of FIG. 28. It is to be noted that the second transmission path 212 which is comprised of resistor 184 is supplied to the subtracting input of adding circuit 214. This results because the encoded signal from input terminal 181a in FIG. 28 is supplied through three inverting operational amplifiers 191,355 and 185 to supply an inverted signal through resistor 184. In like manner, third transmission path 211 provides a signal to the adding input of adding circuit 214 since the signal supplied through high pass filter 183 from input terminal 181a is transmitted through four inverting operational amplifiers 191, 355, 185 and 192. The decoded output signal z is supplied to an output terminal 216 of decoder circuit 210 from first transmission path 213 and can be represented as follows:

$$z = 1/\gamma[y + (\alpha - \beta)z] \quad (18)$$

Equation (18) can be rearranged as follows:

$$\gamma z = y + (\alpha - \beta) z \quad (19)$$

$$(-\alpha + \beta + \gamma) z = y.$$

When equations (17) and (19) are combined, as follows:

$$(-\alpha + \beta + \gamma)x = (-\alpha + \beta + \gamma)z \quad (20)$$

$$x = z \quad (21),$$

it is seen that the original information signal is restored by decoder circuit 210.

Having described specific preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. In apparatus for recording an information signal on a recording medium by a recording device, gain control means comprising:

means defining a first transmission path for compressing said information signal, and including variable gain amplifier means having a gain which varies in response to a control signal supplied thereto and which compresses said information signal in a logarithmically linear manner as a function of said information signal, and control means responsive to the compressed information signal from said variable gain amplifier means for producing said control signal;

means defining a second transmission path for transmitting said information signal with substantially unity gain; and means for effectively supplying the information signal to said recording device by way of said first path when the level of said information signal is below a predetermined value and for effectively supplying said information signal to said recording device by way of said second path with substantially unity gain when the level of said information signal is above said predetermined value.

2. In apparatus for recording an information signal on a recording medium by a recording device, gain control means comprising:

means defining a first transmission path for compressing said information signal and including variable gain amplifier means having a gain which varies in response to a control signal supplied thereto and which compresses said information signal as a function of said information signal, and control means responsive to the compressed information signal from said variable gain amplifier means for producing said control signal, said control means including level detecting means for detecting the level of said compressed information signal from said variable gain amplifier means and for producing a detected output signal in response thereto, and non-linear means for producing said control signal in response to said detected output signal, and in which said level detecting means includes means for logarithmically converting said compressed information signal from said variable gain amplifier means, and amplifier means for producing said detected output signal in response to the logarithmically converted signal;

means defining a second transmission path for transmitting said information signal with substantially unity gain; and means for effectively supplying the information signal to said recording device by way of said first path when the level of said information signal is below a predetermined value and for effectively supplying said information signal to said recording device by way of said second path with substantially unity gain when the level of said information signal is above said predetermined value.

3. In apparatus for recording an information signal on a recording medium by a recording device, gain control means comprising:

means defining a first transmission path for compressing said information signal and including variable gain amplifier means having a gain which varies in response to a control signal supplied thereto and which compresses said information signal as a function of said information signal, and control means responsive to the compressed information signal from said variable gain amplifier means for producing said control signal, in which said control means includes level detecting means for detecting the amplitude of said compressed information signal from said variable gain amplifier means and for producing a detected output signal in response thereto, and non-linear means for producing said control signal in response to said detected output signal, said non-linear means having an input-output amplitude characteristic with a first linear gradient when the amplitude of said detected output signal is less than a first predetermined value, and a second linear gradient greater than said first gradient when the amplitude of said detected output signal is greater than said first predetermined value;

means defining a second transmission path for transmitting said information signal with substantially unity gain; and means for effectively supplying the information signal to said recording device by way of said first path when the amplitude of said information signal is below a second predetermined value corresponding to the first predetermined value and for effectively supplying said information signal to said recording device by way of said second path with substantially unity gain when the amplitude of said information signal is above said second predetermined value.

4. In apparatus for reproducing an information signal from an encoded information signal which has been recorded on a recording medium with the information signal effectively compressed for levels thereof below a predetermined value and with the information signal effectively transmitted with substantially unity gain for levels thereof above said predetermined value; gain control means for reproducing said information signal from said encoded information signal comprising:

means defining a first transmission path for expanding said encoded information signal into an expanded signal and including variable gain amplifier means having a gain which varies in response to a control signal supplied thereto and which produces said expanded signal as a function of said encoded information signal in a logarithmically linear manner, and control means responsive to said encoded information signal for producing said control signal; and means defining a second transmission path for negatively feeding back said expanded signal to said first transmission path with substantially unity gain.

5. In apparatus for reproducing an information signal from an encoded information signal which has been recorded on a recording medium with the information signal effectively compressed for amplitudes thereof below a predetermined value and with the information signal effectively transmitted with substantially unity gain for amplitudes thereof above said predetermined value, gain control means for reproducing said information signal from said encoded information signal comprising:

means defining a first transmission path for expanding said encoded information signal into an expanded signal and including variable gain amplifier means having a gain which varies in response to a control signal supplied thereto and which produces said expanded signal as a function of said encoded information signal, and control means responsive to said encoded information signal for producing said control signal, in which said control means includes level detecting means for detecting the amplitude of said encoded information signal and for producing a detected output signal in response thereto, non-linear means for producing an output signal in response to said detected output signal, and inverting means for producing said control signal in response to said output signal from said non-linear means, said non-linear means having an input-output amplitude characteristic with a first linear gradient when the amplitude of said detected output signal is less than a second predetermined value corresponding to the first-mentioned predetermined value, and with a second linear gradient when the amplitude of said detected output signal is greater than said second predetermined value; and means defining a second transmission path for negatively feeding back said expanded signal to said first transmission path with substantially unity gain.

6. In apparatus for recording an information signal on a recording medium by a recording device, gain control means comprising:

means defining a first transmission path for compressing said information signal and including variable gain amplifier means having a gain which varies in response to a control signal supplied thereto and which compresses said information signal as a function of said information signal, and control means responsive to the compressed information signal from said variable gain amplifier means for producing said control signal, said control means including level detecting means for detecting the level of said compressed information signal from said variable gain amplifier means and for producing a detected output signal in response thereto, and non-linear means for producing said control signal in response to said detected output signal, in which said non-linear means has an input-output level characteristic with a first linear gradient when the level of said detected output signal is less than a first predetermined value, and a second linear gradient greater than said first gradient when the level of said detected output signal is greater than said first predetermined value, and in which said non-linear means includes first and second resistive elements forming a voltage divider for voltage dividing said detected output signal so as to produce said first linear gradient, and means for varying the resistance value of one of said resistive elements for changing the voltage dividing ratio of said voltage divider so as to produce said second linear gradient;

means defining a second transmission path for transmitting said information signal with substantially unity gain; and means for effectively supplying the information signal to said recording device by way of said first path when the level of said information signal is below a second predetermined value corresponding to said first predetermined value and for effectively supplying said information signal to said recording device by way of said second path with substantially unity gain when the level of said information signal is above second predetermined value.

7. Apparatus according to claim 6, in which said means for varying the resistance value includes a series circuit of a diode, means for reverse biasing said diode and a third resistive element, and said series circuit is connected in parallel to said one resistive element.

8. In apparatus for recording an information signal on a recording medium by a recording device, gain control means comprising:

means defining a first transmission path for compressing said information signal and including variable gain amplifier means having a gain which varies in response to a control signal supplied thereto and which compresses said information signal as a function of said information signal, control means responsive to the compressed information signal from said variable gain amplifier means for producing said control signal, limiter means for limiting said compressed information signal from said variable gain amplifier means at two independent levels, in which said limiter means includes at least one transistor having a collector-emitter path connected between the output of said variable gain amplifier means and a reference potential;

means defining a second transmission path for transmitting said information signal with substantially unity gain; and means for effectively supplying the information signal to said recording device by way of said first path when the level of said information signal is below a predetermined value and for effectively supplying said information signal to said recording device by way of said second path with substantially unity gain when the level of said information signal is above said predetermined value.

9. Apparatus according to claim 8, in which said limiter means further includes another transistor connected between the output of said variable gain amplifier means and a reference potential, and a capacitive element connected between the output of said variable gain amplifier means said transistors for imparting a frequency dependency to said limiter means.

10. In apparatus for recording an information signal on a recording medium by a recording device, gain control means comprising:

means defining a first transmission path for compressing said information signal with a first substantially constant compression characteristic when the amplitude of of said information signal is below a predetermined value and with a second substantially constant compression characteristic when the amplitude of said information signal is above said predetermined value;

means defining a second transmission path for transmitting said information signal with substantially unity gain and including a resistive element connected in parallel with said first transmission path; and means for effectively supplying the information signal to said recording device by way of said first path when the amplitude of said information signal is below said predetermined value and for effectively supplying said information signal to said recording device by way of said second path with substantially unity gain when the amplitude of said information signal is above said predetermined value.

11. Apparatus according to claim 10; further including amplifier means having an input supplied with the compressed information signal from said first transmission path and with said information signal with substantially unity gain from said second transmission path whereby said compressed information signal and said information signal with substantially unity gain are added at the input of said amplifier means.

12. In apparatus for reproducing an information signal from an encoded information signal which has been recorded on a recording medium with the information signal effectively compressed for levels thereof below a predetermined value and with the information signal effectively transmitted with substantially unity gain for levels thereof above said predetermined value; gain control means for reproducing said information signal from said encoded information signal comprising:

an input terminal;

means defining a first transmission path for expanding said encoded information signal into an expanded signal and including variable gain amplifier means having a gain which varies in response to a control signal supplied thereto and which produces said expanded signal as a function of said encoded information signal, control means responsive to said encoded information signal for producing said control signal, and limiter means for coring said encoded information signal, in which said limiter means includes first and second diodes connected in parallel and opposing relation between said input terminal and said variable gain amplifier means; and means defining a second transmission path for negatively feeding back said expanded signal to said first transmission path with substantially unity gain.

13. Apparatus according to claim 12; in which said limiter means includes additional amplifier means having input and output terminals, said first and second diodes are connected in parallel between said input and output terminals of said amplifier means, a capacitive element connects said input terminal of the additional amplifier means to a reference potential, and a series circuit of a resistive element and another capacitive element is connected in parallel with another resistive element between the output terminal of said additional amplifier means and said first and second diodes for imparting a frequency characteristic to said limiter means.

14. In apparatus for reproducing an information signal from an encoded information signal which has been recorded on a recording medium with the information signal effectively compressed for levels thereof below a predetermined value and with the information signal effectively transmitted with substantially unity gain for levels thereof above said predetermined value; gain control means for reproducing said information signal from said encoded information signal comprising:

means defining a first transmission path for expanding said encoded information signal into an expanded signal;

means defining a second transmission path for negatively feeding back said expanded signal to said first transmission path with substantially unity gain; and a de-emphasis circuit connected to said first and second transmission paths for de-emphasizing the high frequency components of said encoded information signal.

15. Apparatus according to claim 14; further including a third transmission path for positively feeding back the high frequency components of said expanded signal to said first transmission path.

16. In apparatus for recording an information signal on a recording medium by a recording device, gain control means comprising:

means defining a first transmission path for compressing said information signal and including variable gain amplifier means having a gain which varies in response to a control signal supplied thereto and which compresses said information signal as a function of said information signal, control means responsive to the compressed information signal from said variable gain amplifier means for producing said control signal, and limiter means for limiting said compressed information signal from said variable gain amplifier means at two independent levels, in which said limiter means includes a diode limiter circuit having first and second diodes, each connected in parallel between the output of said variable gain amplifier means and a reference potential, and each being arranged in opposing relation to the other;

means defining a second transmission path for transmitting said information signal with substantially unity gain; and means for effectively supplying the information signal to said recording device by way of said first path when the level of said information signal is below a predetermined value and for effectively supplying said information signal to said recording device by way of said second path with substantially unity gain when the level of said information signal is above said predetermined value.

17. Apparatus according to claim 16; in which said limiter means further includes a capacitive element connected between said reference potential and said firt and second diodes for providing a second reference potential higher than said first mentioned reference potential for low frequency components of said information signal.

18. Apparatus according to claim 17; in which said limiter means further includes a first resistive element connected between the output of said variable gain amplifier means and said first and second diodes and a series circuit of a capacitive element and a resistive element connected in parallel with said first resistive element so as to reduce the effective resistance between the output of said variable gain amplifier and said first and second diodes for high frequency components of said information signal.

19. In apparatus for recording an information signal on a recording medium by a recording device, gain control means comprising:

means defining a first transmission path for compressing said information signal;

means defining a second transmission path for transmitting said information signal with substantially unity gain and including a resistive element connected in parallel with said first transmission path;

means for effectively supplying the information signal to said recording device by way of said first path when the level of said information signal is below a predetermined value and for effectively supplying said information signal to said recording device by way of said second path with substantially unity gain when the level of said information signal is above said predetermined value, said means for effectively supplying including amplifier means having an input signal supplied with the compressed information signal from said first transmission path and with said information signal with substantially unity gain from said second transmission path whereby said compressed information signal and said information signal with substantially unity gain are added at the input of said amplifier means, and pre-emphasis means connected to said first and second transmission paths for pre-emphasizing the high frequency components of said information signal.

20. Apparatus according to claim 19; further including means defining a third transmission path for de-emphasizing high level, high frequency components of the information signal whereby a substantially flat frequency characteristic is imparted by said apparatus to high level components of said information signal.

21. Apparatus according to claim 20; in which said means defining a third transmission path includes high pass filter means for transmitting only high frequency components of said information signal, and means for subtracting said high frequency components of said information signal from the added signal produced by the addition of said compressed information signal and said information signal with substantially unity gain for high levels of said information signal.

22. In apparatus for recording an information signal on a recording medium by a recording device, gain control means comprising:

means defining a first transmission path for compressing said information signal with a first substantially constant compression characteristic when the amplitude of said information signal is below a predetermined value and with a second substantially constant compression characteristic when the amplitude of said information signal is above said predetermined value;

means defining a second transmission path for transmitting said information signal with substantially unity gain; and means for effectively supplying the information signal to said recording device by way of said first path when the amplitude of said information signal is below said predetermined value and for effectively supplying said information signal to said recording device by way of said second path with substantially unity gain when the amplitude of said information signal is above said predetermined value.

23. Apparatus according to claim 22; in which said means defining the first transmission path includes variable gain amplifier means having a gain which varies in response to a control signal supplied thereto and which compresses said information signal as a function of said information signal, and control means response to the compressed information signal from said variable gain amplifier means for producing said control signal.

24. Apparatus according to claim 23; in which said control means includes level detecting means for detecting the amplitude of said compressed information signal from said variable gain amplifier means and for producing a detected output signal in response thereto, and non-linear means for producing said control signal in response to said detected output signal.

25. Apparatus according to claim 23; in which said means defining the first transmission path further includes limiter means for limiting said compressed information signal from said variable gain amplifier at two independent amplitudes.

26. In apparatus for reproducing an information signal from an encoded information signal which has been recorded on a recording medium with the information signal effectively compressed for amplitudes thereof below a predetermined value and with the information signal effectively transmitted with substantially unity gain for amplitudes thereof above said predetermined value; gain control means for reproducing said information signal from said encoded information signal comprising:

means defining a first transmission path for expanding said encoded information signal into an expanded signal with a first substantially constant expansion charcteristic when the amplitude of said information signal is below said predetermined value and with a second substantially constant expansion characteristic when the amplitude of said information signal is above said predetermined value; and means defining a second transmission path for negatively feeding back said expanded signal to said first transmission path with substantially unity gain.

27. Apparatus according to claim 26; in which said means defining the second transmission path includes a feedback resistor for negatively feeding back said expanded signal to said first transmission path.

28. Apparatus according to claim 26; in which said means defining a first transmission path includes variable gain amplifier means having a gain which varies in response to a control signal supplied thereto and which produces said expanded signal as a function of said encoded information signal, and control means responsive to said encoded information signal for producing said control signal.

29. Apparatus according to claim 28; in which said control means includes level detecting means for detecting the amplitude of said encoded information signal and for producing a detected output signal in response thereto, non-linear means for producing an output signal in response to said detected output signal, and inverting means for producing said control signal in response to said output signal from said non-linear means.

30. Apparatus according to claim 28; in which said means defining a first transmission path further includes limiter means for coring said encoded information signal.

* * * * *